(12) United States Patent
Roberts et al.

(10) Patent No.: US 7,482,863 B2
(45) Date of Patent: Jan. 27, 2009

(54) EXPANDED PERFORMANCE AND FUNCTIONS FOR VACUUM TUBE REPLACEMENT DEVICES

(75) Inventors: Douglas H. Roberts, Bellevue, WA (US); Brett A. Hertzberg, Bellevue, WA (US)

(73) Assignee: Roberts Retrovalve, Inc., Bellevue, WA (US)

( * ) Notice: Subject to any disclaimer, the term of this patent is extended or adjusted under 35 U.S.C. 154(b) by 43 days.

(21) Appl. No.: 11/836,674

(22) Filed: Aug. 9, 2007

(65) Prior Publication Data

US 2007/0285156 A1    Dec. 13, 2007

Related U.S. Application Data

(63) Continuation-in-part of application No. 11/678,562, filed on Feb. 23, 2007, now Pat. No. 7,408,401, and a continuation-in-part of application No. 11/203,077, filed on Aug. 12, 2005, now Pat. No. 7,286,060.

(51) Int. Cl.
*H03F 5/00* (2006.01)

(52) U.S. Cl. ............................................. 330/3; 330/49

(58) Field of Classification Search ...................... 330/3, 330/4.6, 41, 42, 43, 44, 49
See application file for complete search history.

(56) References Cited

U.S. PATENT DOCUMENTS

| 2,056,852 | A | * | 10/1936 | Hayden | ...................... 381/94.6 |
| 2,077,550 | A | * | 4/1937 | Dalpayrat | ..................... 330/64 |
| 3,345,468 | A | * | 10/1967 | Schlatter | ..................... 360/66 |
| 2007/0285156 | A1 | * | 12/2007 | Roberts et al. | .............. 327/574 |

* cited by examiner

*Primary Examiner*—Henry K Choe
(74) *Attorney, Agent, or Firm*—Merchant & Gould PC

(57) ABSTRACT

Methods are provided for solid-state implementation of a vacuum tube replacement device that supplements the functional performance of the target replacement device, i.e., a traditional glass vacuum tube. Example functions may include OEM or user adjustable parameters such as gain and/or frequency response (e.g. transfer function), current and/or voltage saturation thresholds, bias condition, input and/or output impedance, linear-to-non-linear transfer function(s) (e.g. soft clipping parameters), power dissipation, communication protocols, and audio/visual indication parameters such as signal limiting detection, safety, stress, or wear-out conditions, and tube emulation model type to name a few. The methods presented for the vacuum tube replacement device system(s) are equally useful for non-vacuum tube systems such as audio amplifier circuits.

38 Claims, 12 Drawing Sheets

US 7,482,863 B2

EXPANDED PERFORMANCE AND FUNCTIONS FOR VACUUM TUBE REPLACEMENT DEVICES

RELATED APPLICATIONS

This utility patent application claims the benefit under 35 U.S.C. § 120 as a continuation-in-part of U.S. patent application Ser. No. 11/678,562, titled "VACUUM TUBE REPLACEMENT DEVICE, CIRCUIT AND SYSTEM", which was filed Feb. 23, 2007, and U.S. patent application Ser. No. 11/203,077, titled "INDICATORS FOR VACUUM TUBE REPLACEMENT DEVICES", which was filed Aug. 12, 2005, both of which are hereby incorporated by reference in their entirety.

FIELD OF THE INVENTION

The present disclosure generally relates to solid state systems, circuits, and devices that may be used to replace vacuum tubes, such as pin-for-pin compatible devices. Such devices may be employed in audio amplifiers including guitar/musical instrument amplifiers, hi-fi amplifiers, and any application circuit that may benefit from such replacement devices.

BACKGROUND

Glass vacuum tubes have been widely used in audio applications such as amplification of musical instruments as well as hi-fidelity reproduction. Although solid-state circuit technology has also been developed for use in such audio applications, traditional glass-envelope vacuum tubes are still being used in some audio applications. Modern audio applications often use glass vacuum tubes for their acoustic properties, as well as their esthetic appeal.

Solid-state technology has been acknowledged for cost, performance, manufacturability, and/or other advantages over glass vacuum tubes. Solid-state devices can be significantly less expensive to manufacture, smaller in size, less prone to mechanical failures and wear-out anomalies as compared to glass vacuum tubes. Some solid-state systems and implementations have been developed to emulate the overall functional operation of a glass vacuum tube.

Direct pin-for-pin compatible vacuum tube replacement devices (VTRDs) have also been developed such as is described by the present author in U.S. patent application Ser. No. 11/678,562, titled "VACUUM TUBE REPLACEMENT DEVICE, CIRCUIT AND SYSTEM". The present disclosure describes solid-state circuits that can be incorporated into VTRDs to effectively emulate the functions of traditional glass-envelope vacuum tubes with greatly expanded functionality beyond that available in conventional glass vacuum tube devices. As will be further described, the present disclosure contemplates applying the described system, circuits and devices in other non-vacuum tube replacement applications.

BRIEF DESCRIPTION OF THE DRAWINGS

Non-limiting and non-exhaustive embodiments are described with reference to the following drawings.

DETAILED DESCRIPTION

Figure 1:
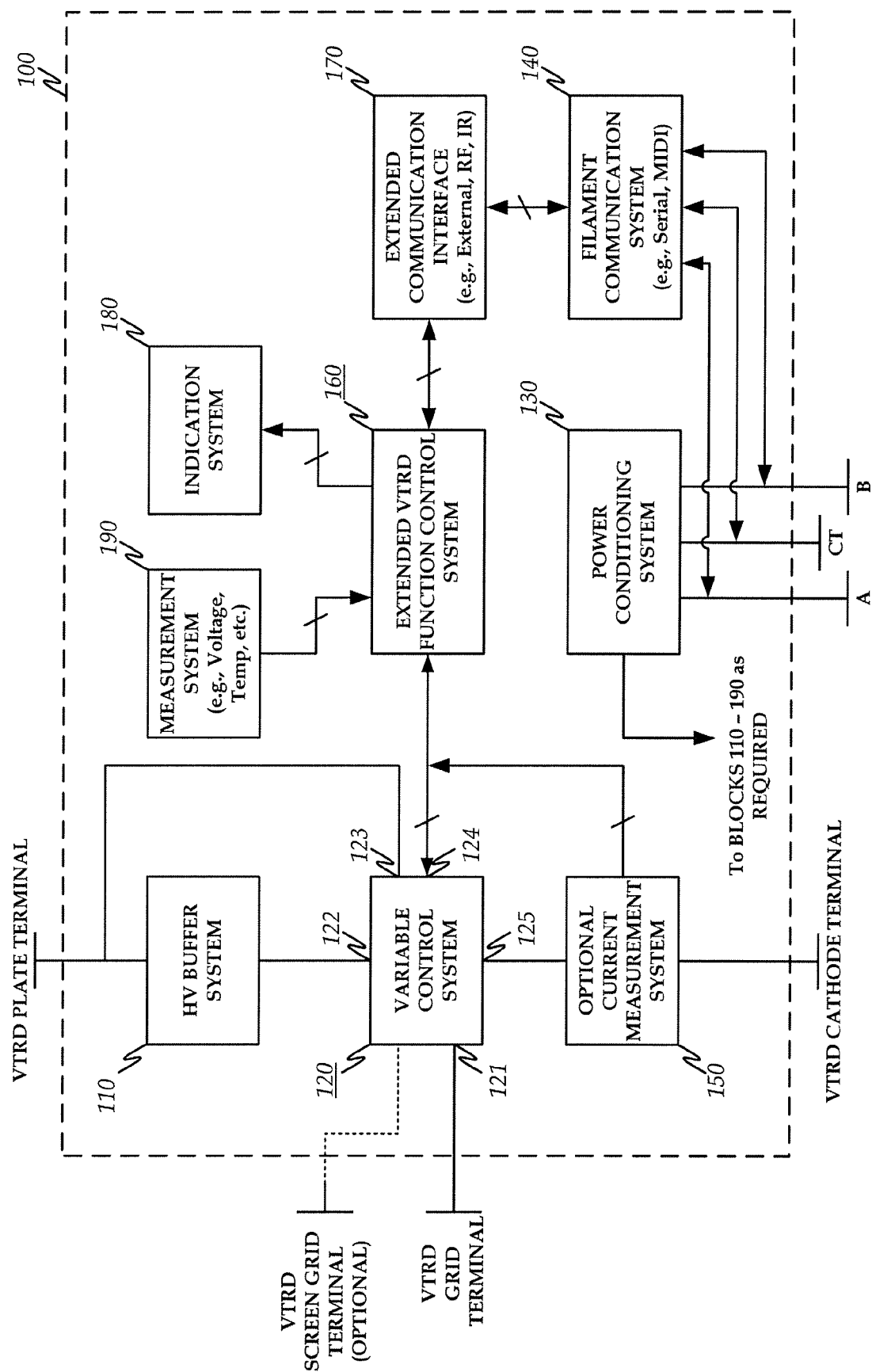
FIG. 1 is a block diagram of an example VTRD system that includes additional functions and systems such as measurement, control, and interface features.

Various embodiments will be described in detail with reference to the drawings, where like reference numerals represent like parts and assemblies throughout the several views. Reference to various embodiments does not limit the scope of the present disclosure, which is limited only by the scope of the claims attached hereto.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. The meaning of "in" may include "in" and "on." The term "connected" may mean a direct electrical, electro-magnetic, mechanical, logical, or other connection between the items connected, without any electrical, mechanical, logical or other intermediary there between. The term "coupled" can mean a direct connection between items, an indirect connection through one or more intermediaries, or communication between items in a manner that may not constitute a connection. The term "circuit" can mean a single component or a plurality of components, active and/or passive, discrete or integrated, that are coupled together to provide a desired function. The term "signal" can mean at least one current, voltage, charge, data, or other such identifiable quantity. Additionally, any examples set forth in this specification are not intended to be limiting and merely set forth some of the many possible embodiments for the claimed invention.

Briefly stated, the present disclosure generally relates to systems, circuits, and devices that replace the functions of a traditional glass-envelope vacuum tube with a solid-state vacuum tube replacement device (VTRD). The VTRD emulates the operation of an electron vacuum tube and also expands the functional performance beyond conventional vacuum tube devices. Example functions may include the following original-equipment-manufacturer (OEM) or user adjustable parameters: gain and/or frequency response (e.g. transfer function), current and/or voltage saturation thresholds, bias condition, input and/or output impedance, linear-to-non-linear transfer function(s) (e.g. soft clipping parameters), power dissipation, communication protocols, and audio/visual indication parameters such as signal limiting detection, safety, stress, or wear-out conditions, and tube emulation model type to name a few. An example tube emulation model type function may be simply to configure the gain and frequency response of the VTRD to match a conventional pre-amplifier tube (e.g., 12AX7, 12AT7, 12AU7, etc.).

The presently described VTRD can be configured as pin-for-pin compatible with standard vacuum tube devices such as triodes and pentodes, with pin base arrangements such as octal 7-pin, octal 8-pin, Noval B9A, or other styles to name a few. Each pin of an example VTRD may be arranged to function in a standard vacuum tube pin configuration such as, for example, one or more: plate, grid, cathode, and filament connections. The vacuum tube pin configurations may be for preamplifier vacuum tubes, power amplifier vacuum tubes, as well as combined preamplifier/power amplifier vacuum tubes. Example preamplifier vacuum tubes include styles such as: 12AX7, 12AT7, 12AU7, 6922, 7025, 6CG7, etc. Example power amplifier vacuum tubes include styles such as: EL34, EL84, 6L6, 6V6, 6550, 5881, KT66, KT88, etc. The VTRD is also equally useful in non-vacuum tube replacement applications such as audio amplifier circuits.

FIG. 1 is an illustration of an example VTRD system (100) that includes additional VTRD measurement, control and interface functions. VTRD system 100 includes a high-voltage (HV) buffer system (110), a variable control system (120), a power conditioning system (130), a filament supply communications system (140), an optional current measurement system (150), an extended VTRD function control system (160), an extended communications interface (170), an indication system (180), and a measurement system (190). Each of the described systems (110-190) can be arranged as individual electronic circuits that each provide a desired function, as a combination of one or more electronic circuits arranged in cooperation to provide the overall desired functionality, or as a single electronic circuit providing all of the functions integrated together. External signal interfaces to the VTRD system (100) include a grid terminal, plate terminal, cathode terminal, filament terminals A, B, and CT (center-tap), and an optional screen grid terminal for emulation of pentode type vacuum tubes.

The variable control system (120) includes a signal input terminal (121), an output terminal (122), a feedback terminal (123), an input/output (I/O) terminal (124), and a return terminal (125). The signal input terminal (121) for the variable control system (120) is coupled to the VTRD grid terminal. The return terminal (125) for the variable control system (120) is coupled to the VTRD cathode terminal via the optional current measurement system (150). The output terminal (122) of the variable control system (120) is coupled to the VTRD plate terminal via the HV buffer system (110). The feedback terminal (123) of the variable control system (120) is also coupled to the VTRD plate terminal. The I/O terminal (124) of the variable control system (120) is arranged in communication with the extended VTRD function control system (160). The extended VTRD function control system (160) is also arranged in communication with the optional current measurement system (150), the filament communication system (140) via the extended communication interface (170), the indication system (180), and the measurement system (190). The filament communication system (140) is coupled to the VTRD filament supply terminals.

The VTRD system (100) is arranged to modulate current between the VTRD plate terminal and VTRD cathode terminal during operation. The HV buffer system (110) is arranged to isolate the high voltages (e.g., +100V to +400V relative to the cathode terminal) present at the plate terminal from the output (122) of the variable control system (120). The variable control system (120) is a voltage controlled current modulator (e.g., transconductance system) which dynamically controls the current flow between the output terminal (122) and the return terminal (125) in response to signals received at the signal input terminal (121). The current modulation conditions are established by the VTRD transfer function (via the variable control system 120) and the voltage input conditions present at the VTRD grid and/or VTRD screen grid terminals relative to the VTRD cathode. The VTRD transfer function ideally replicates that of a target glass vacuum tube device for a direct functional replacement. As will be demonstrated in detail throughout this disclosure, several benefits can be realized by incorporating additional or altered functionality as presented by example VTRD system (100) that expands beyond those functions provided by a traditional glass vacuum tube device.

The feedback terminal (123) of the variable control system (120) is configured to sense the VTRD plate terminal voltage and related operating conditions to establish servo or other dynamic closed loop VTRD operation. The extended VTRD function control system (160) may communicate with the variable control system (120) to enable discrete and/or continuous performance modification to the target VTRD system, which may include both audible and non-audible target control adjustments. Example VTRD performance adjustments may include user and pre-defined modification of the target VTRD frequency response (e.g., tone control), gain (e.g. volume), emitted color and color-code indexing (e.g., visual indicators), signal or control interface, error/warning sensing index (e.g. temperature or dynamic range clipping), communication mode (e.g., VTRD addressing hierarchy), etc.

The power conditioning system (130) is coupled to the VTRD filament terminals A, B, and optionally CT, and arranged to provide power supply regulation, filtering, isolation and other power conditioning functions as may be required to the VTRD blocks 110-190. The supplied power or local power supply can be derived from power received at the filament terminals, and/or various other power terminals such as the VTRD plate or cathode terminals. In some examples, the local power supply can be isolated from the filament terminals such as by a DC-to-DC converter or an AC-to-DC converter.

The filament communication system (140) is an optional block that can be coupled to the filament terminal and arranged to facilitate communications for each VTRD in a target amplifier using the filament-power supply (a.k.a. as the heater supply) as a communication channel. An output of the filament communication system (140) can be coupled either to the extended VTRD function control system (160) or to the optional extended communication interface (170). Data signals can be modulated or otherwise encoded in the filament supply by the filament communication system (140). In some examples, data signals can be encoded using a serial-communication protocol.

In one example, the serial-communication protocol corresponds to an RS485-type communication packet. In another example, the serial-communication protocol corresponds to a MIDI-type communication packet. The serial-communication protocol may also include a preamble that precedes a header, which is followed by the specific data signals. The preamble can be a simple sequence that is intended to alert the filament communication system (140) that the header and data signals will follow. The header can include an addressing scheme including a global broadcast to all VTRDs, individual communications to each VTRD, or a communication to an external command processor (not shown).

The specific data signals in the communication can be interpreted as commands for the VTRDs. In one example, each VTRD is programmed into a specified operating mode in response to the commands that are found in the specific data signals. The filament communication system (140) can also be arranged to facilitate inter-communications over the existing filament wiring between VTRD devices within the same target amplifier system when multiple VTRD devices are utilized. Since the VTRDs can be designed as direct pin replacements to vacuum tubes, the filament communication system (140) enables communications without significant modifications to the target system application. This is especially useful for conventional vacuum tube guitar amplifiers, where the VTRD devices may be used as an after-market replacement to the conventional vacuum tube devices.

The optional current measurement system (150) can be coupled between the VTRD cathode terminal and the return terminal (125) of the variable control system (125, and arranged to sense the return path current to the VTRD cathode terminal. The current measurement system (150) can provide the sense current measurement to the extended VTRD function control system (160) for VTRD digital-domain processing, and/or to the variable control system (120 via I/O terminal 124) for real-time dynamic feed-forward or feedback VTRD control functions. The current measurement system (150) can be used to facilitate the implementation of additional VTRD functions that are not available in traditional glass-vacuum tube devices. The present disclosure contemplates that the described current measurement system (150) can be used to assist in extended functions such as current saturation indication, continuous or discontinuous transfer function modulation based on instantaneous, filtered, or electron-current histogram performance, operating power indication (when included with the VTRD plate terminal measurement), and indication of VTRD related fault conditions to name a few.

Figure 2:
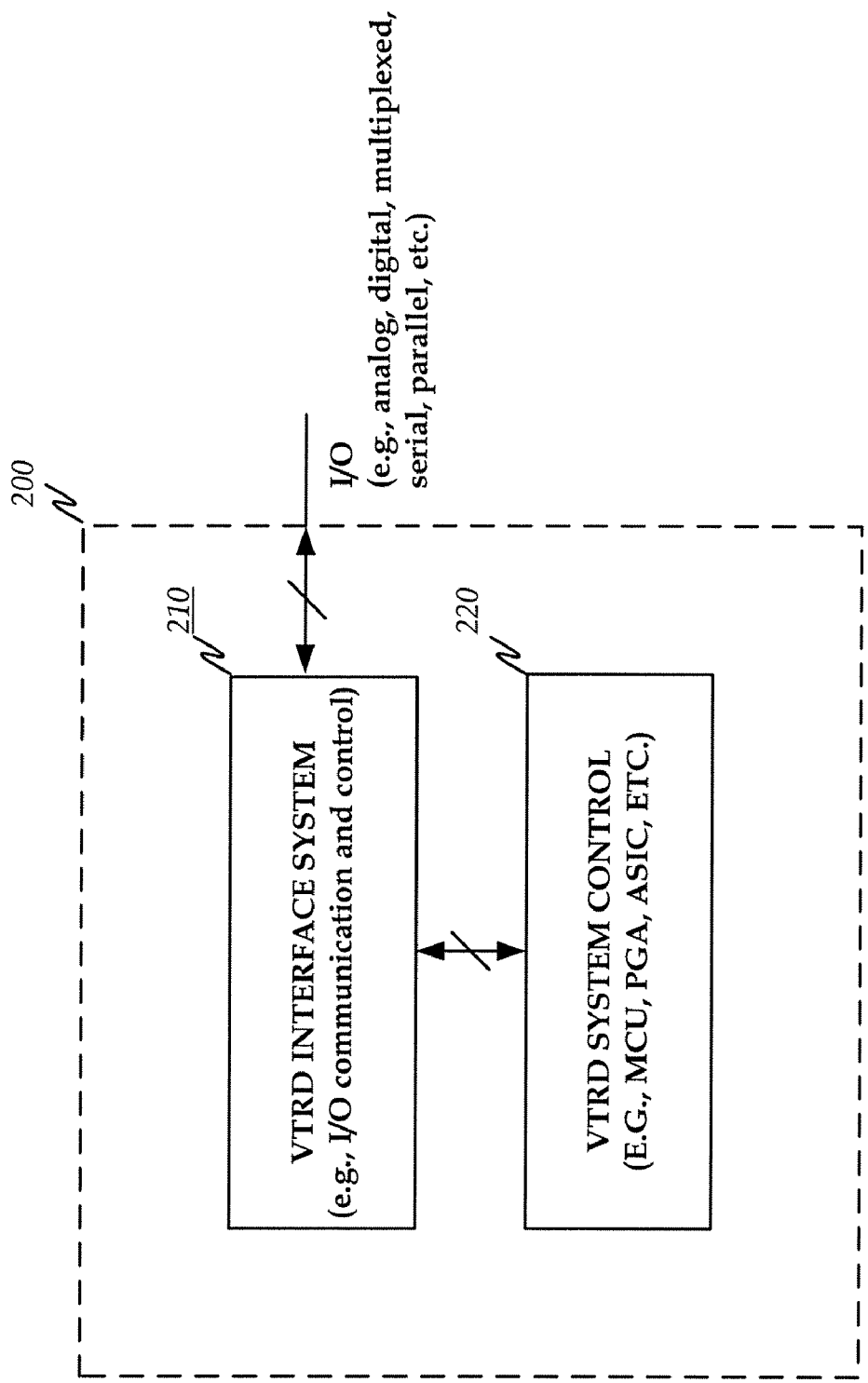
FIG. 2 illustrates the functional and/or physical partitions in an extended VTRD function control system.

The extended VTRD function control system (160) can be coupled to the I/O terminal (124) of the variable control system (160), and arranged to manage data flow, signal processing functions and to adjust controls between the various systems and circuits. Communications outside of the VTRD can optionally be facilitated under the control of the extended VTRD function control system (160) by utilizing either the extended communication interface (170) or the filament communication system (140). Communication between the extended VTRD function control system (160) and other VTRD systems (110, 120, 130, 140, 150, 170, 180, and 190) may be accomplished with a common communication channel or separate communication channels in an analog, digital, or mixed analog-digital domain. Further description for the extended VTRD function control system (160) is illustrated in FIG. 2.

The extended communications interface (170) is optionally coupled to the extended VTRD function control system (160) to expand the input/output (I/O) functionality of the VTRD (100). Example I/O interfaces include radio-frequency (RF) protocols such as Blue-Tooth or ZigBee, infrared (IR), and optical communication systems, etc, to name a few. An example advantage of using an extended communications interface (170), such as described here, is the ability to send and receive data, commands, and/or status to other VTRD's in a target application independent of the VTRD audio signal path. The extended communication interface (170) can also be utilized to transmit/receive data, commands and/or status to an external device (not shown) for diagnostic purposes, monitoring purposes, or any other reasonable purpose. By way of non-limiting examples, the data, status and command signals can represent an operating mode for the VTRD, a voltage or current measurement for the VTRD, a voltage or current limit setting of the VTRD, a gain setting for the VTRD, a frequency response setting for the VTRD, an operational status of the VTRD (e.g., go-no/go status), etc.

The indication system (180) can optionally be coupled to the extended VTRD function control system (160), and can be used to enhance the aesthetic nature and/or user awareness of the VTRD status including functionality, safety, or any other required VTRD operating condition via lights (LEDs), displays, or audio queues. The indication system (180) is arranged in communication with the extended VTRD function control system (160) and may be in direct communication with any other VTRD system or circuit as required to minimize MCU overhead or indication latency. Advantages of the indication system (180) include VTRD indication of a biasing condition, an operational status, a failure status, a filament supply status, a high-voltage supply status, a cathode/plate voltage status, a cathode/plate current status, an idle current operating class, a signal limiting detection, a power delivery/limiting detection, an operating temperature, an over-power condition, an over-voltage condition, an over-current condition, an over-temperature condition, a saturation condition, a wear-out or stress modality, a safety alert, a gain setting, a tube-type emulation model, a sound characteristic, an equalization setting, a filter setting, and/or real-time performance of the VTRD.

Measurement system (190) is optionally coupled to the extended VTRD function control system (160), and can be arranged to collect and communicate various measurements for the VTRD to the extended VTRD function control system (160). Example measurements include, but are not limited to operating temperature measurements, total power dissipation measurements (e.g., measured plate voltage and cathode current), system voltage performance (e.g. power conditioning system (130) supply voltage, VTRD plate voltage, VTRD grid voltage, etc.), and additional VTRD system current measurements to name a few. The extended VTRD function control system (160) is also arranged to processes the measurements (e.g., digital-domain processing) and can use the measurements to adjust control signals for the variable control system (120) via I/O terminal 124. The extended VTRD function control system (160) can thus be used for real-time control with the variable control system (120) for either dynamic feed-forward or feedback VTRD control functions.

The measurement system (190) can also be arranged to facilitate the implementation of additional VTRD functions not available in traditional glass-vacuum tube devices. It is comtemplated that the measurement system (190) can be arranged to assist in a variety of functions such as for providing: an indication means for identifying clipping in the VTRD plate terminal voltage, a system state query such as VTRD system "state-of-health", "total time of operation (e.g., accumulated hours or minutes of use)", a state-based quiescent current or bias current setting, or an indication means for identifying a wear-out status or stress modality.

The example embodiment of FIG. 1 has several advantages of which a few have been described herein. The various functional and/or physical partitions illustrated by FIG. 1 are merely intended to serve as example functional and/or physical partitions, and the various partitions may be separated or integrated into one or more different physical and or functional partitions. Not every system and circuit may be required in all applications, and thus the elimination of various functional partitions is considered within the scope of the present disclosure.

FIG. 2 illustrates example functional partitions of an extended VTRD function control system (200) associated with a VTRD, which includes a VTRD interface system (210) and a VTRD system control (220). Each of the described systems (210 and 220) can be arranged as individual circuits that each provide a desired function, as a combination of one or more circuits arranged in cooperation to provide the overall desired functionality, or as a single circuit providing all of the functions integrated together.

The VTRD system control (220) is coupled to the VTRD interface system (210). The VTRD interface system (210) is arrange to provide a means for sending and receiving I/O signals for communication and control to other VTRD blocks external to the extended VTRD function control system (200). The VTRD interface system (210) I/O may include facility for a digital, analog, and/or mixed analog/digital interface. The I/O communication and control may be implemented via a single channel or a multi-channel interface, and may utilize serial and/or parallel communication protocols, either synchronously or asynchronously. Example I/O interfaces include, but or not limited to an analog-to-digital converter (ADC), a digital-to-analog converter (DAC), a parallel-to-serial converter, a serial-to-parallel converter, a timer circuit, an interrupt controller, etc. Example VTRD I/O interfaces are described further with reference to FIGS. 10 and 11.

The VTRD system control (220) is arranged to manage and process data from the various VTRD systems and circuits. The VTRD system control (220) includes any appropriate variety of processor such as, for example, a general purpose microprocessor, a general purpose microcontroller (MCU), a digital signal processor (DSP), a programmable gate array (PGA), or an application specific integrated circuit (ASIC). In some instances, the processor can be provided as a discrete part; while in other instances the processor can be provided as a core that is integrated into another circuit such as a processor core in a system-on-chip (SOC) circuit. The VTRD system control (220) may include firmware that is arranged in cooperation with the processor for program and data storage such as stored in read-only memory (ROM), electrically programmable read-only memory (EPROM), electrically erasable programmable read-only memory (EEPROM), flash programmable read-only memory, battery backed random access memory (RAM), or any other appropriate storage means.

Several advantages are realized when incorporating a processor such as described for the VTRD system control (220), including the ability to execute digital signal processing (DSP) functions and algorithms. For example, VTRD input signals can be monitored and processed using DSP functions as may be needed by the variable control system (block 120 described in FIG. 1), such as Finite-Impulse-Response (FIR), Infinite-Impulse-Response (IIR), and Circular-Integrator-Comb (CIC) type filters, Fast-Fourier-Transforms (FFT) or Discrete-Fourier-Transforms (DFT), convolution of time domain window functions (e.g. Hanning, Hamming, etc.), real-time numerical analysis algorithms, or other VTRD signal analysis algorithms. Other potential advantages include the ability to monitor and report VTRD system status, which may be derived from the results of a VTRD system control (220) self test for example, to the user or monitor and reporting between VTRDs in the target application. Further advantages may be realized by the presently described VTRDs such as storing and retrieving user setup information received via the extended communications interface (170) or storing and retrieving user setup information via the filament communication system (140). The setup information may be stored in an EEPROM in the VTRD system control (220) for example, or any other reasonable memory storage means. User setup information may include command instructions to modify the VTRD transfer function such as gain, bandwidth, VTRD bias, indicator function, or any other desired VTRD function that a user may wish to modify. Multiple user setups may be stored for future recall, allowing a user to change the VTRD functional performance on demand based on pre-programmed user settings.

The various functional and/or physical partitions illustrated by FIG. 2 are merely intended to serve as example functional and/or physical partitions, and the various partitions may be separated or integrated into one or more different physical and/or functional partitions as may be desired. In some implementations one or more of the physical or functional partitions may be eliminated without departing from the spirit of the present disclosure.

Figure 3:
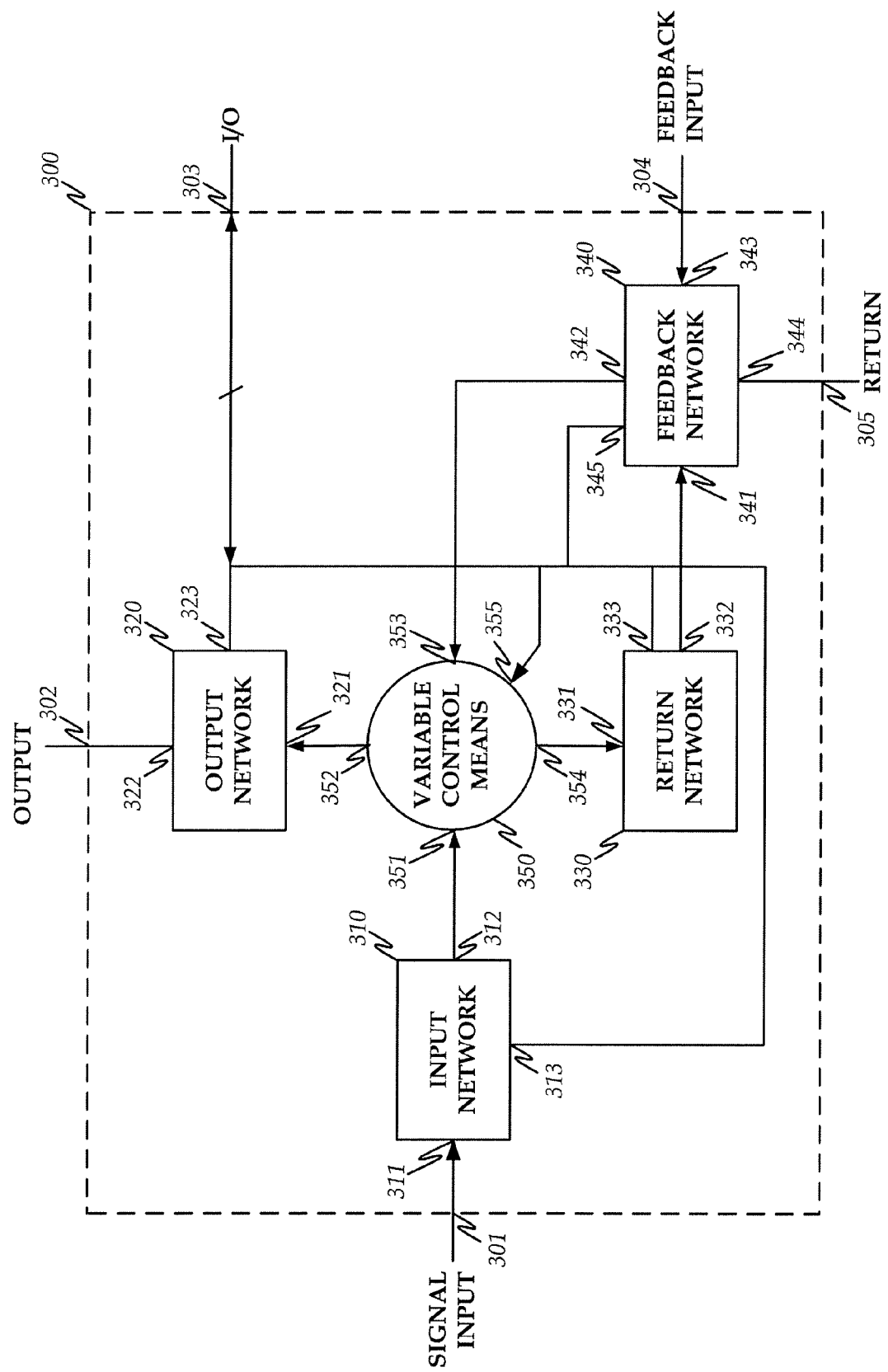
FIG. 3 illustrates the functional and/or physical partitions of an example variable control system associated with a VTRD.

FIG. 3 illustrates example functional partitions of a variable control system (300) associated with a VTRD, which includes an input network (310), an output network (320), a return network (330), a feedback network (340), and a variable control means (350). For clarification pertinent to this disclosure, a network is defined as a combination of one or more electronic components or circuits (either passive or active) arranged in cooperation to provide a desired functionality. Each of the described networks, means and systems (310, 320, 330, 340, and 350) can be arranged as individual circuits that each provide a desired function, as a combination of one or more circuits arranged in cooperation to provide the overall desired functionality, or as a single circuit providing all of the functions integrated together.

The input network (310), the output network (320), and the return network (330) each include an input terminal (311, 321 and 331, respectively) and an output terminal (312, 322 and 332, respectively). The feedback network (340) includes two input terminals (341 and 343), an output terminal (342), and a bi-directional terminal (344). The variable control means (350) includes a signal input terminal (351), a feedback input terminal (353), and two output terminals (352 and 354). The signal interfaces to the variable control system (300) include a signal input terminal (301), an output terminal (302), an I/O terminal (303), a feedback terminal (304), and a return terminal (305). The input network (310), output network (320), return network (330), feedback network (340), and variable control means (350) each include a communication terminal (313, 323, 333, 345, and 355 respectively) arranged for bi-directional communication to an extended VTRD function control system (described in FIG. 1 and FIG. 2) via the I/O terminal 303. Although many of the terminals and signal inputs are pictured as input terminals and output terminals, these terminals can be considered bi-directional depending on the specific context for an implementation. Each terminal connection can also be as arranged for multiple signals (e.g., buses), differential signals, or single signals as may be necessary.

Signal input terminal 301 is coupled to the input terminal (311) of the input network (310). Output terminal 302 is coupled to the output terminal (322) of the output network (320). Feedback terminal 304 is coupled to a first input terminal (343) of the feedback network (340). Return terminal 305 is coupled to the bi-directional terminal (344) of the feedback network (340). The output terminal (312) of the input network (310) is coupled to a signal input terminal (351) of the variable control means (350). The second input terminal (353) of the variable control means (350) is coupled to the output terminal (342) of the feedback network (340). The first output terminal (352) of the variable control means (350) is coupled to the input terminal (321) of the output network (320), while the second output terminal (354) of the variable control means (350) is coupled to the input terminal (331) of the return network (330). The output terminal (332) of the return network (330) is coupled to another input terminal (341) of the feedback network (340).

In operation, the variable control means (350) is arranged to dynamically control signal gain and buffering functions responsive to signals applied at the signal input terminal (301) and the feedback input terminal (304) relative to operational currents and voltages provide at the output terminal (302) and the return terminal (305) of the variable control system (300). The signal input terminal (301) is coupled to the variable control means through the input network (310), which can be configured for various functional utilities for the variable control means input terminal such as controlling the input impedance (e.g., via an adjustable impedance circuit), limiting the input dynamic range (e.g., via a signal limiter circuit), and providing electrostatic discharge (ESD) protection (e.g., via an ESD protection circuit), etc. The output terminal (302) is effectively coupled to the output terminal (352) of the variable control means (350) through the output network (320), which can be arranged for various functional utilities for the variable control means output terminal such as limiting the maximum current (e.g., via a current limiter circuit), controlling signal bandwidth or frequency response (e.g., via a bandwidth control circuit), and analog-to-digital conversion for DSP functions, etc. The return terminal (305) is effectively coupled to the variable control means (350) via the return network (330) as combined with the feedback network (340), while the feedback input (304) is effectively coupled to the variable control means (350) via the feedback network (340). The return network (330) can be configured for functional utilities for the variable control means return terminal such as controlling signal gain (e.g., via a gain control circuit), controlling signal bandwidth (e.g., via a bandwidth control circuit), and sensing signals (described later), etc. The feedback network (340) may be arranged for functional utilities such as setting a VTRD bias condition, sensing an auxiliary signal (e.g. sensing control or other signals encoded in the audio signal path), and providing non-linear VTRD transfer function dynamics, etc.

The I/O communication and control signal(s) transmitted or received via terminal 303 may be digital, analog, and/or mixed analog/digital signals. The I/O data may be derived by single or multiple channels, and may utilize serial and/or parallel communication protocols, synchronously or asynchronously. The I/O communication and control function for the variable control system (300) facilitates communicate to an extended VTRD function control system in a VTRD for any variety of functions such as receiving process updates, archiving user settings, or to facilitate signal processing for the variable control system (300).

The various functional and/or physical partitions illustrated by FIG. 3 are merely intended to serve as example functional and/or physical partitions, and the various partitions may be separated or integrated into one or more different physical and/or functional partitions as may be desired. In some implementations one or more of the physical or functional partitions may be eliminated without departing from the spirit of the present disclosure.

Figure 4:
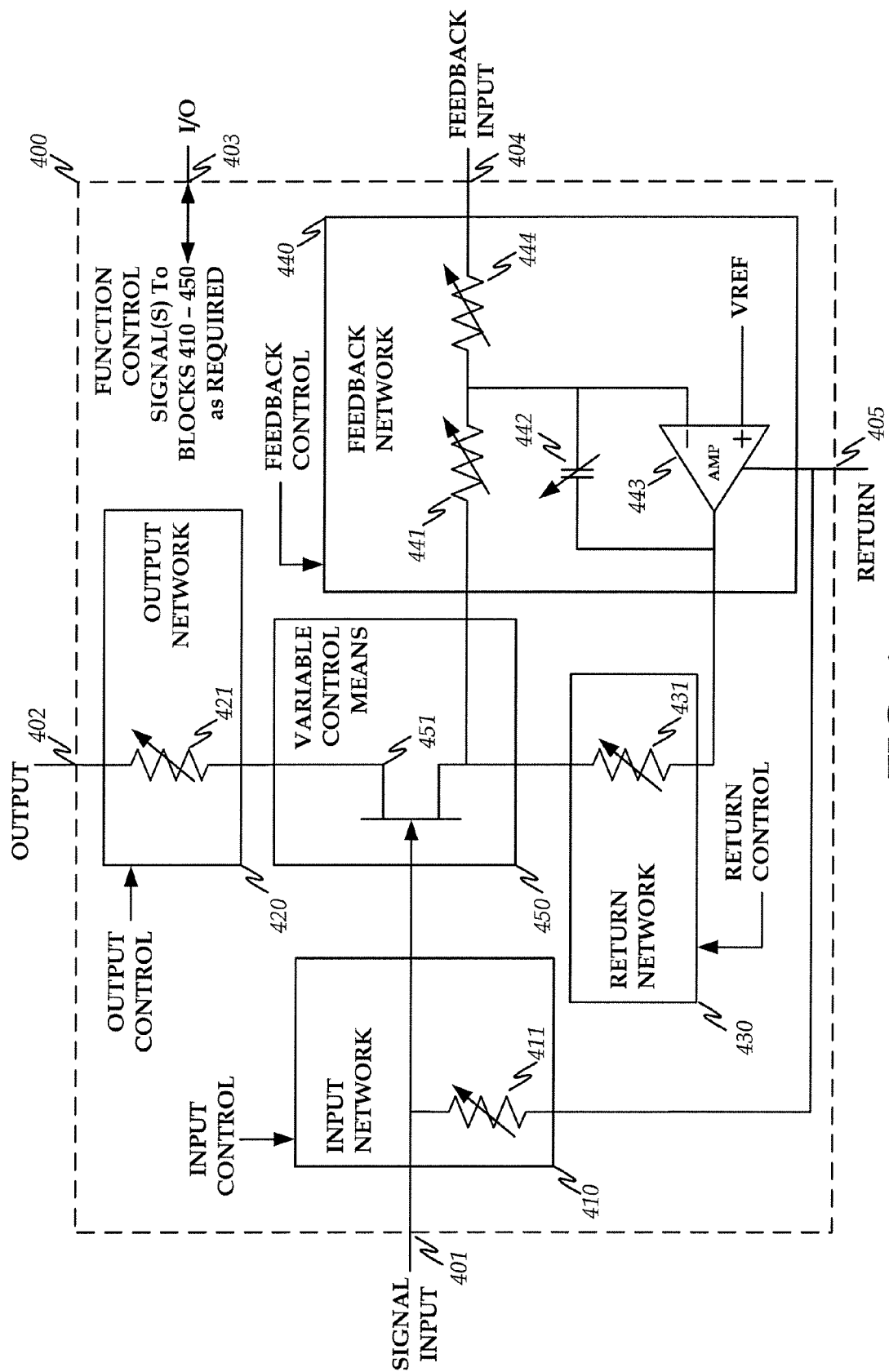
FIG. 4 illustrates an example circuit arrangement for a variable control system associated with a VTRD.

FIG. 4 illustrates an example circuit arrangement for a variable control system (400) associated with a VTRD, which includes an input network (410), an output network (420), a return network (430), a feedback network (440), and a variable control means (450).

The basic functional partitions in FIG. 4 are the same as those described with reference to FIG. 3. The signal interfaces to the variable control system (400) include a signal input terminal (401), output terminal (402), I/O terminal (403), feedback terminal (404), and return terminal (405). The signal input terminal (401) is coupled to the input terminal of the input network (410). The output terminal (402) is coupled to the output terminal of the output network (420). The I/O terminal (403) is coupled to blocks 410-450 as required. The feedback terminal (404) is coupled to an input terminal of the feedback network (440). The return terminal (405) is coupled to the feedback network (440).

The variable control means (450) in this embodiment is illustrated as an N-channel JFET (451). Other devices and circuits may also function effectively for this purpose (e.g. bipolar junction transistors or BJTs, metal oxide semiconductor field effect transistors or MOSFETs, etc.). The input network (410) is represented in the present example by a variable resistor circuit (411). The output network (420) is represented in the present example by a variable resistor circuit (421). The return network (430) is represented in the present example by a variable resistor circuit (431). The feedback network (440) includes differential amplifier circuit (443), a variable capacitor circuit (442), and two variable resistor circuits (441 and 444).

The signal input terminal (401) for the variable control system (400) is coupled to the gate terminal of the JFET (451) and shunted by the variable resistor circuit (411) in the input network (430) to the return (405). The output terminal (402) of the variable control system (400) is coupled to the drain terminal of JFET (451) through the variable resistor circuit (421) in the output network (420). The source terminal of JFET (451) is coupled to the variable control system (400) return terminal (405) via the variable resistor circuit (431) in the return network (430) and through the feedback network (440). The variable resistor circuit (444) in the feedback network (440) is coupled between the feedback input terminal (404) and the inverting (−) input terminal of the differential amplifier circuit (443). The variable capacitor circuit (442) in the feedback circuit (440) is coupled between the inverting (−) input terminal and the output of the differential amplifier circuit (443), and can be used for VTRD system closed-loop bandwidth control and stability compensation. The variable capacitor circuit (442) may include a series impedance (e.g., a resistor or inductor . . . not shown) that establishes a zero in the frequency domain transfer function to improve the local stability of the differential amplifier circuit (443). The non-inverting (+) input terminal of the differential amplifier circuit (443) is coupled to a voltage reference (VREF).

The differential amplifier circuit (443) output serves as a low impedance return path for the JFET (451) via the return network (430). Variable resistor circuit 441 is coupled from the source of the JFET (451) to the inverting (−) input terminal of the differential amplifier circuit (440), establishing a voltage source node at the JFET (451) source to control the cut-off/bias (e.g. JFET Vgs threshold) for the JFET (451). Under stable linear closed-loop operating conditions, the ideal differential amplifier circuit (443) will force the voltage at the inverting (−) input terminal to equal the voltage at the non-inverting (+) input terminal. The voltage at the non-inverting (+) input terminal may be controlled by the VTRD system (e.g. extended VTRD function control system), which may be determined by preset, user defined, or real-time criteria. In some example systems, the voltage at the non-inverting (+) terminal of differential amplifier circuit (443) can be dynamically adjusted (e.g., programmable) to modify the bias current of the VTRD.

A typical VTRD system application for a variable control system couples the feedback input (404) to the VTRD plate terminal to sense the VTRD plate voltage, thus establishing a real-time bias-servo arrangement. The real-time bias-servo arrangement enables the VTRD system to operate over extended plate voltage ranges (e.g. +100V to +450V) and current ranges (e.g., 1 mA to 10 mA), and thus a variety of plate load impedances used in the target application. The example variable resistor and capacitor circuits (411, 421, 431, 441, 442, and 444) may be discretely or continuously modified in response to command signals received via the I/O terminal (403), described later. The circuit functional description for FIG. 4 is merely intended to present an example of operation for a variable control system in a VTRD. As will be demonstrated separately, modifications to individual blocks 410-440 may provide expanded performance and functionality to a target VTRD system.

Figure 5:
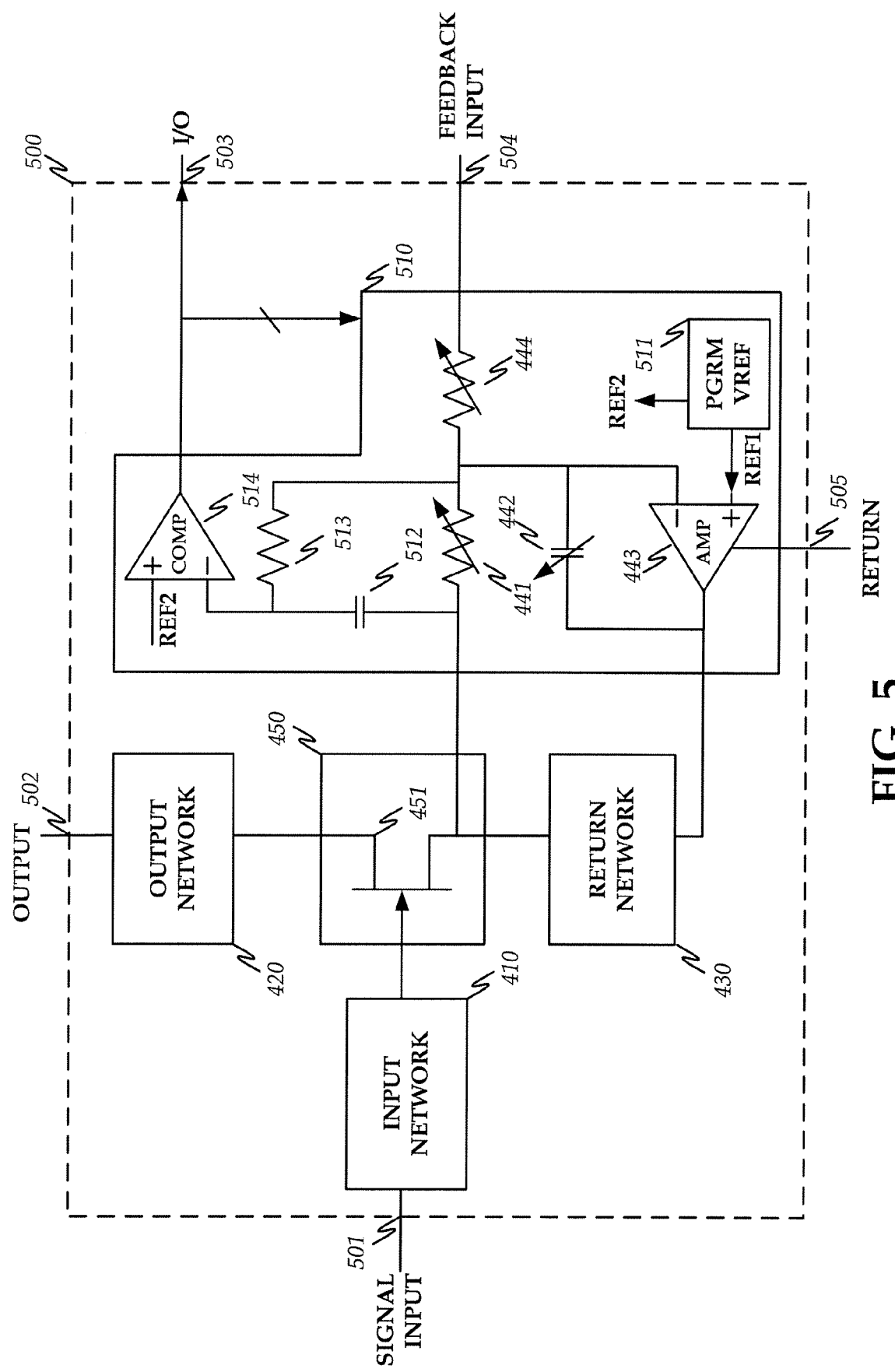
FIG. 5 illustrates an example circuit arrangement for a feedback network associated with a variable control system in a VTRD.

FIG. 5 illustrates an example variable control system (500) circuit arrangement for a feedback network (510) associated with a VTRD that includes additional functionality. Variable control system (500) includes the previously described variable control means (450) that is illustrated with example N-channel JFET (451), input network (410), output network (420), and return network (430), as described with reference to FIGS. 3 and 4. The feedback network (440) of FIG. 4 is replaced with another feedback network (510) and includes a means for I/O communication as depicted in FIG. 5.

The basic functional partitions in FIG. 5 are the same as those described with reference to FIGS. 3 and 4, and like components are labeled identically. The signal interfaces to the variable control system (500) include a signal input terminal (501), an output terminal (502), an I/O terminal (503), a feedback terminal (504), and a return terminal (505). The signal input terminal (501) is coupled to the input terminal of the input network (410). The output terminal (502) is coupled to the output terminal of the output network (420). The I/O terminal (503) is coupled to feedback network (510) in this example. The feedback input terminal (504) is coupled to an input terminal of the feedback network (510). The return terminal (505) is coupled to the feedback network (510).

The feedback network (510) includes previously described differential amplifier circuit (443), variable capacitor circuit (442), and variable resistor circuits (441 and 444). The feedback network (510) also includes programmable reference voltages REF1 and REF2 (511). REF1 is coupled to the non-inverting (+) input terminal of the differential amplifier circuit (443) for dynamic control of the VTRD bias state (e.g., see prior discussion of FIG. 4) or other real-time modulation protocols and may be controlled via I/O control signals present at the I/O terminal (503). The example embodiment of feedback network (510) includes an additional capacitor circuit (512), an additional resistor circuit (513), and a comparator circuit (514). Capacitor circuit 512 is coupled between the source terminal of the JFET (451) and the inverting (−) input terminal of the comparator circuit (514). Resistor circuit 513 is coupled between the inverting (−) input terminal of the comparator circuit (514) and the inverting (−) input terminal of the differential amplifier circuit (443). The programmable reference voltage REF2 (511) is coupled to the non-inverting (+) input terminal of the comparator circuit (514).

Circuits 512-514 are arranged to detect/convert analog signals present at the source of the JFET (451) into a digital domain serial data stream, which then may be communicated to other VTRD systems (e.g., extended VTRD function control system 160) regarding the detected analog signal condition and behavior. Benefits of this example analog-to-digital decoding scheme include the ability to establish/receive communications for coded signals embedded in the audio signal path (auxiliary signal sensing via JFET 451). Such auxiliary signals are comtemplated to be outside the audio spectrum (including harmonics) in order to be useful for practical application in an off-the-shelf target amplifier. As such, capacitor circuit 512 and resistor circuit 513 are arranged to form a high-pass pole that filters out in-band audio signals from the comparator circuit (514).

The example embodiment shows resistor circuit 513 terminating at the inverting (−) input terminal of differential amplifier circuit 443. The termination point for resistor circuit 513 is selected as a matter of convenience, and assumes practical stability at this node (application dependant). The example analog filter example demonstrated by the use of capacitor circuit 512 and resistor circuit 513 may include more complex filter solutions as required for practical audio signal and auxiliary signal decoupling. The functional descriptions provided here for the feedback network (510) are not limited to these functions and are intended to demonstrate various practical applications useful for VTRD's in a target application.

Figure 6:
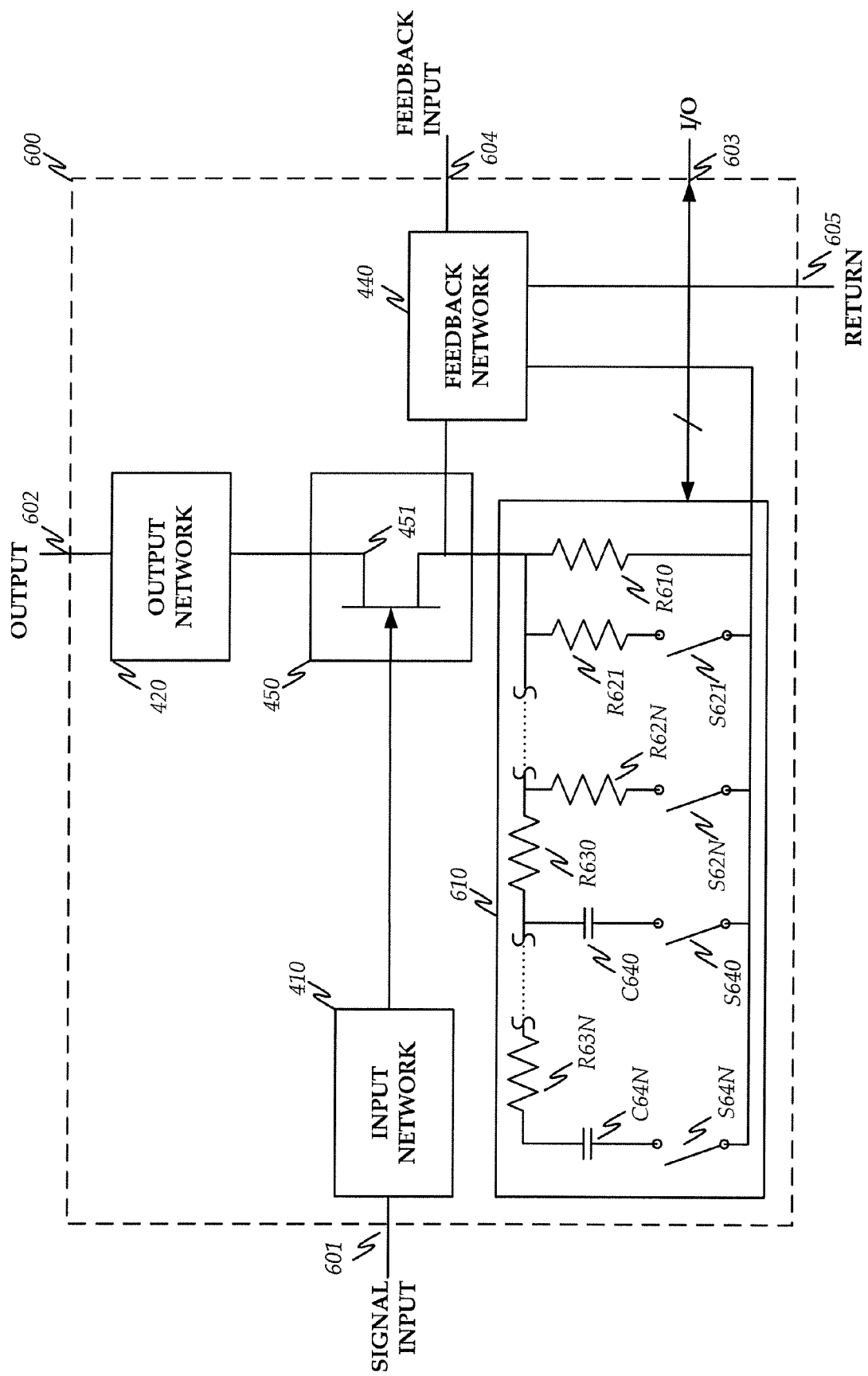
FIG. 6 illustrates an example circuit arrangement for a return network associated with a variable control system in a VTRD.

FIG. 6 illustrates an example variable control system (600) circuit arrangement for a return network (610) associated with a VTRD that includes additional functionality. Variable control system (600) includes the previously described variable control means (450) that is illustrated with example N-channel JFET (451), input network (410), output network (420), and feedback network (440) as described with reference to FIGS. 3 and 4. The return network (430) of FIG. 4 is replaced with another return network (610) and includes a means for I/O communication as depicted in FIG. 6.

The basic functional partitions in FIG. 6 are the same as those described with reference to FIGS. 3 and 4, and like components are labeled identically. The signal interfaces to the variable control system (600) include a signal input terminal (601), an output terminal (602), an I/O terminal (603), a feedback terminal (604), and a return terminal (605). The return network (610) includes resistor circuit R610, resistor circuits R621-R62N, corresponding switching circuits S621-S62N, resistor circuits R630-R63N, capacitor circuits C640-C64N, and corresponding switching circuits S640-S64N.

The example circuit embodiment illustrates an adjustable impedance circuit that allows for controlled incremental changes in the effective resistance between the JFET (451) source and the VTRD return (via the feedback network 440) terminal by inclusion of resistor circuits R621-R62N in parallel with resistor circuit R610 via activation of switches S621-S62N (via the control signal from the input-output terminal (603) as required. This allows for a digitally adjustable DC gain feature for the VTRD system.

The described resistor/switch topology is similar to a digital-to-analog converter system such as current/resistor ladder. The example circuit embodiment allows for controlled incremental changes in the effective impedance between the JFET (451) source and the VTRD return (via the feedback network 440) terminal by inclusion of the series combination of resistor-circuits R630-R63N and capacitor-circuits C640-C64N, in parallel with resistor circuit R610 and resistor circuits R621-62N (if enabled) via activation of switches S640-S64N as required. This operates as a digitally adjustable gain circuit or a digital adjustable frequency response circuit for adjusting the gain/frequency response attribute for the VTRD system. It is contemplated that continuously variable resistive and capacitive circuits may replace the static representations shown in FIG. 6 using voltage, current, or digitally controlled equivalents. A continuous control method alternative is contemplated for the incremental switching approach presented for the return network (610) using ADC/DAC/DSP techniques, an example of which is described later for the output network in FIG. 9.

At least one advantage of the described circuit topology in the example embodiment of FIG. 6 is the capability for the MCU in the VTRD system to adjust the gain and frequency response (i.e., transfer function) as determined by preset, user defined, or real-time criteria. The functional descriptions provided here for the variable control system (600) return network (610) are not limited to these functions and are intended to demonstrate various practical applications useful for VTRD's in a target application.

Figure 7:
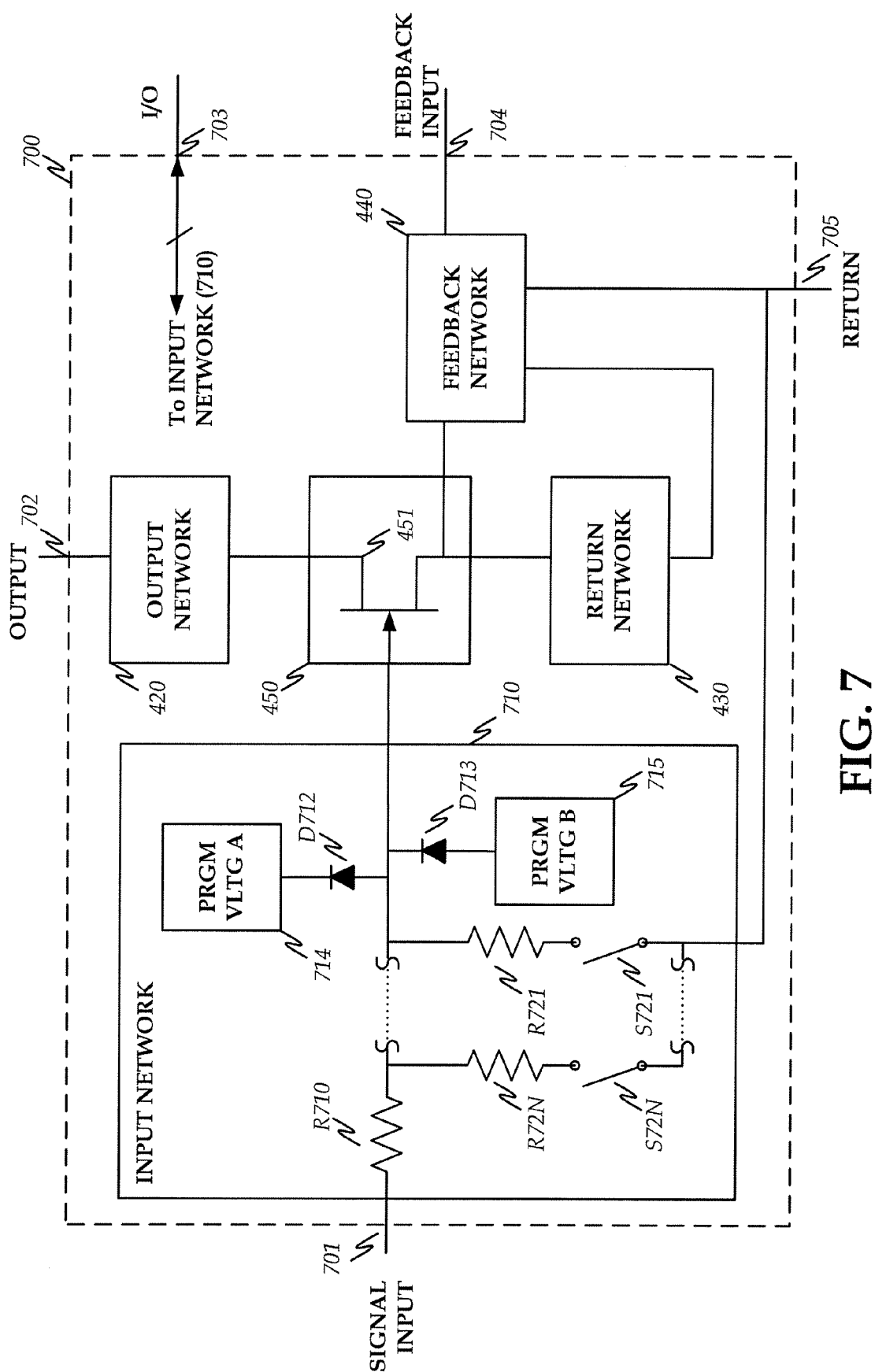
FIG. 7 illustrates an example circuit arrangement for an input network associated with a variable control system in a VTRD.

FIG. 7 illustrates an example variable control system (700) circuit arrangement for an input network (710) associated with a VTRD that includes additional functionality. Variable control system (700) includes the previously described variable control means (450) that is illustrated with example N-channel JFET (451), output network (420), return network (430), and feedback network (440), as described with reference to FIGS. 3 and 4. The input network (410) of FIG. 4 is replaced with another input network (710) and includes a means for I/O communication as depicted in FIG. 7.

The basic functional partitions in FIG. 7 are the same as those described with reference to FIGS. 3 and 4, and like components are labeled identically. The signal interfaces to the variable control system (700) include a signal input terminal (701), an output terminal (702), an I/O terminal (703), a feedback terminal (704), and a return terminal (705). The input network (710) includes resistor circuit R710, diode circuits D712 and D713, programmable voltage sources 714 (PRGM VLTG A) and 715 (PRGM VLTG B), resistor circuits R721-R72N, and corresponding switching circuits S721-S72N. Programmable voltage sources 714 and 715 may be independently controlled positive or negative sources relative to the return terminal (705), which can be programmed in response to I/O control signals present at the I/O terminal (703).

Some advantages of the example embodiment of input network (710) is the ability to control or limit the input dynamic range, or intentionally create a current load at the VTRD input for grid current leakage emulation, such as associated with some traditional vacuum tube device input characteristics. In addition, the example circuit embodiment allows for controlled incremental changes in the effective resistance between the variable control system (700) signal input terminal (701) and the return (via the feedback network 440) terminal (705) by inclusion of parallel resistor circuits R721-R72N that selectively terminate through the return terminal (705) via the activation of switches S721-S72N as required. This allows for a digitally adjustable input resistance/impedance feature for the VTRD system.

A continuous control method alternative is contemplated for the incremental switching approach presented for the input network (710) using voltage controlled variable resistors (e.g., transistors configured to operate as linear resistors through biasing), digitally modulated resistance means, etc., for resistor circuits R710 and R721-R72N. Modulated/integrated (via a pulse-width-modulated metal-oxide-semiconductor-field-effect-transistor or PWM modulated MOSFET) capacitive and inductive means are also contemplated for adjustable input impedance control in addition to the described resistor circuits. The functional descriptions provided here for the variable control system (700) input network (710) are not limited to these functions and are intended to demonstrate various practical applications useful for VTRD's in a target application.

Figure 8:
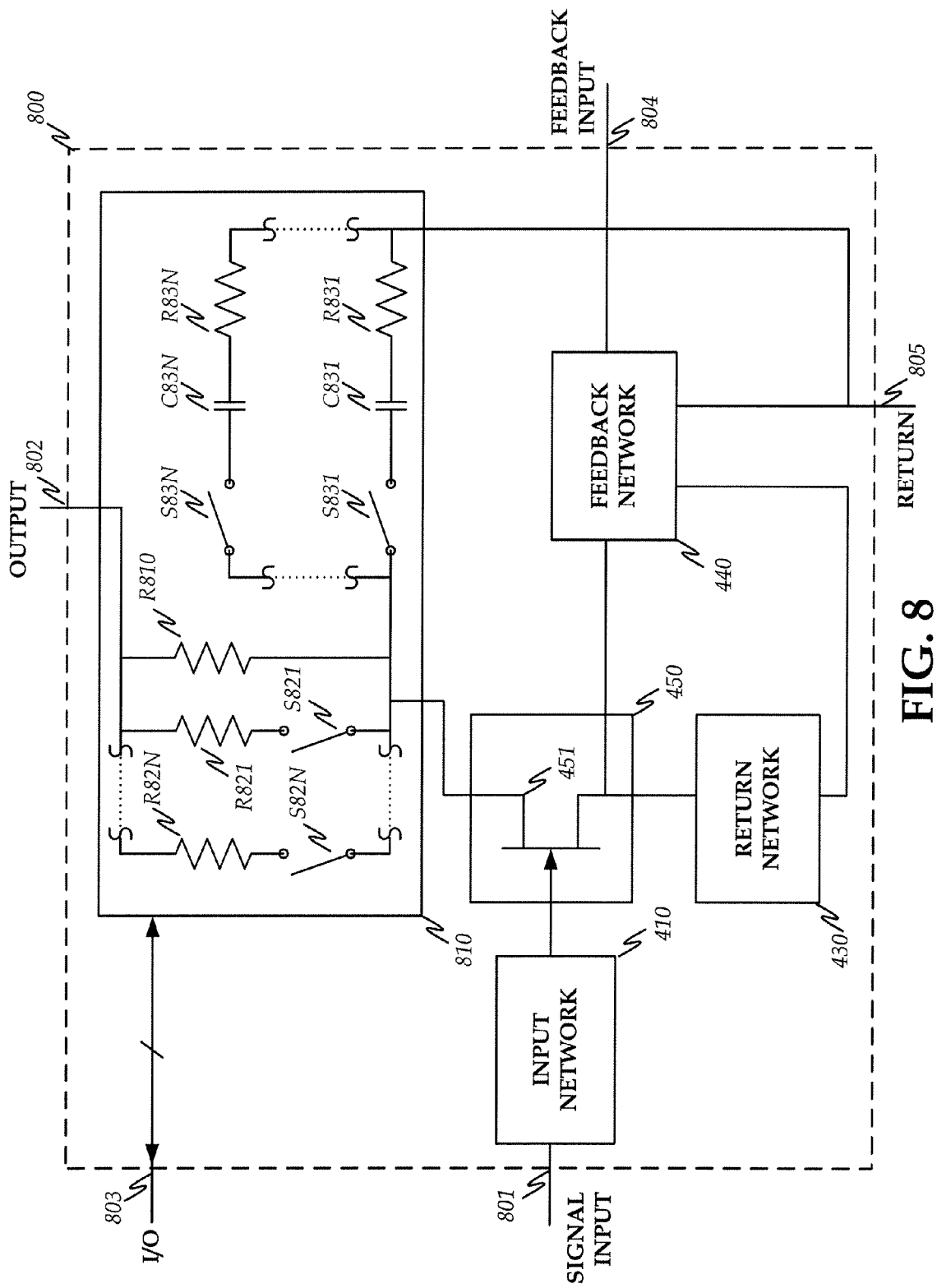
FIGS. 8 and 9 illustrate example circuit arrangements for an output network associated with a variable control system in a VTRD.

FIG. 8 illustrates an example variable control system (800) circuit arrangement for an output network (810) associated with a VTRD that includes additional functionality. Variable control system (800) includes the previously described variable control means (450) that is illustrated with example N-channel JFET (451), input network (410), return network (430), and feedback network (440), as described with reference to FIGS. 3 and 4. The output network (420) of FIG. 4 is replaced with another output network (810) and includes a means for I/O communication as depicted in FIG. 8.

The basic functional partitions in FIG. 8 are the same as those described with reference to FIGS. 3 and 4, and like components are labeled identically. The signal interfaces to the variable control system (800) include a signal input terminal (801), an output terminal (802), an I/O terminal (803), a feedback terminal (804), and a return terminal (805). The output network (810) includes resistor circuit R810, resistor circuits R821-R82N, switching circuits S821-S82N, resistor circuits R831-R83N, capacitor circuits C831-C83N, and switching circuits S831-S83N.

Resistor circuit R810 is series coupled between output 802 and the drain of JFET 451 in variable control means (450). Resistors R810-R82N are each arranged to be selectively coupled in parallel with resistor circuit R810 via operation of a corresponding on of switching circuits S821-S822. Each of resistor circuits 831-83N are series coupled through a corresponding one of capacitors C831-C83N and an associated one of switch circuits S831-S83N.

The described example circuit embodiment allows for controlled incremental changes in the effective resistance between the JFET (451) drain and the VTRD output terminal by selectively coupling resistor circuits R821-R82N in parallel with resistor circuit R810 (via switch circuits S821-S82N) as required. This allows for a digitally adjustable current limit feature for the VTRD system.

The example circuit of FIG. 8 also allows for controlled incremental changes in the effective impedance between the drain of JFET 451 (the variable control means) and the return terminal (805) by selective inclusion of the series combination of resistor circuits R831-R83N and capacitor circuits C831-C83N (via switch circuits S831-S83N). This allows for a digitally adjustable high-frequency roll-off response attribute (e.g., a high pass filter to the return path) for the VTRD system.

It is contemplated that continuously variable resistive and capacitive circuits may replace the static representations shown in FIG. 8 using voltage, current, or digitally controlled equivalents. A continuous control method alternative is contemplated for the incremental switching approach presented for the output network (810) as is demonstrated in FIG. 9. The functional descriptions provided here for the variable control system (800) input network (810) are not limited to these functions and are intended to demonstrate various practical applications useful for VTRD's in a target application.

Figure 9:
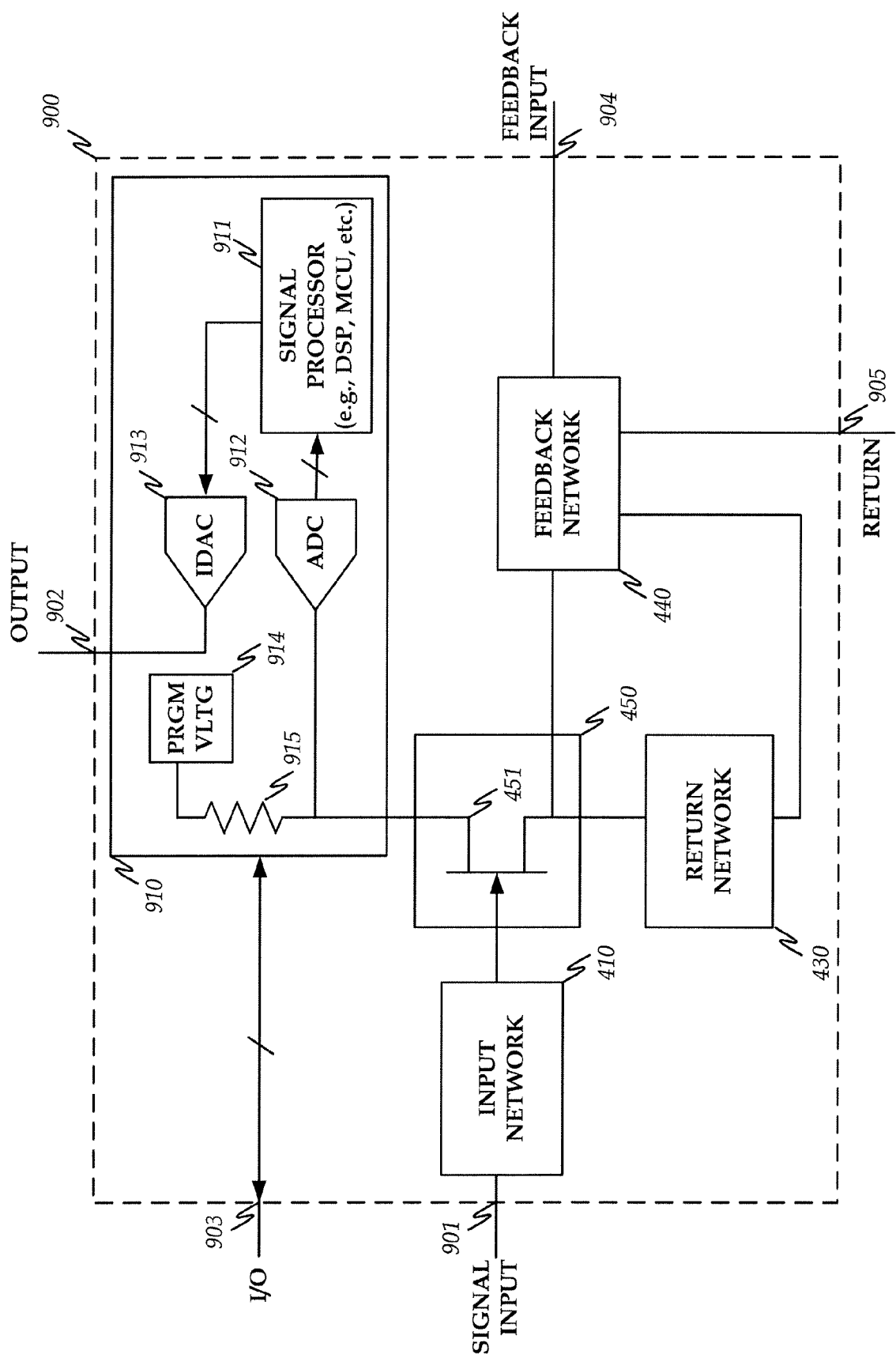

FIG. 9 illustrates an example variable control system (900) circuit arrangement for an output network (910) associated with a VTRD that includes additional functionality. Variable control system (900) includes the previously described variable control means (450) that is illustrated with example N-channel JFET (451), input network (410), return network (430), and feedback network (440), as described with reference to FIGS. 3 and 4. The output network (420) of FIG. 4 is replaced with another output network (910) and includes a means for I/O communication as depicted in FIG. 9.

The basic functional partitions in FIG. 9 are the same as those described with reference to FIGS. 3 and 4, and like components are labeled identically. The signal interfaces to the variable control system (900) include a signal input terminal (901), an output terminal (902), an I/O terminal (903), a feedback terminal (904), and a return terminal (905). An output network (910) is illustrated that demonstrates an example method of analog signal conversion to the digital domain, processing, and re-conversion to the analog domain, which may be particularly useful in a VTRD application. As such, the concept of digital-signal-processing (i.e., an ADC/DSP/DAC process interface) or DSP techniques applied to any practical VTRD signal function application (e.g., transfer function) described thus far, is considered a natural progression of present technology relevant to this disclosure.

Output network (900) includes a DSP engine (911), an ADC (912), a current DAC or IDAC (913), a programmable voltage source (914) and a resistor circuit (915). The drain of the JFET (451) in the variable control means (450) is coupled to the input of the ADC (912) and also coupled to the programmable voltage source (914) via resistor circuit (915). The output of the ADC (912) is coupled to an input of the DSP engine (911). The output of the DSP engine (911) is coupled to an input of the IDAC (913). The output of the IDAC (913) is coupled to the output (902) of the variable control system (900). The IDAC (913) is ideally referenced to the variable control system (900) return (905) (not shown).

During operation, current flows through resistor circuit 915 that is at least proportional to the current flowing in variable control means 450 (e.g., the current flowing through the drain of JFET 451). A voltage drop develops over resistor circuit 915 that is sensed as an input voltage to ADC 912, which converts the voltage drop into a digitally coded quantity that is equivalent to the current through variable control means 450. The DSP engine (911) processes the digitally coded quantity, and the DSP engine results are coupled to an input of the IDAC (913). The IDAC (913) outputs a sink current to the variable control system (900) output (902).

The resolution of the ADC (912) is expected to be acceptable for the anticipated dynamic range for the current VTRD system parameter settings. The ADC (912) may be a sigma-delta type converter, flash converter, successive-approximation type converter using conventional sampling methods (i.e., standard Nyquist/anti-alias), successive-approximation type converter with over sampling including dither averaging, or any other analog-to-digital conversion type required to meet the VTRD system requirements. Similarly, the resolution of the IDAC (913) is also matched to the desired dynamic range using any appropriate topology.

The DSP engine (911) may execute real-time VTRD signal functions such as CIC (Cyclic-Integral-Comb), FIR (Finite-Impulse-Response), IIR (Infinite-Impulse-Response), type filter functions, etc., FFT (Fast-Fourier-Transform), DFT (Discrete-Fourier-Transform) or other signal analysis functions, specific-spectrum quadrature detection, temporal RMS histogram, curve-fitting, and non-linear time domain window functions and algorithms, to name a few. Such DSP functions incorporated into a VTRD architecture allow for many powerful advantages over a traditional or standard vacuum tube device.

The functional descriptions provided here for the variable control system (900) output network (910) are not limited to the above described functions, which are intended to provide illustrative examples of various practical applications useful for VTRD's in a target application.

Figure 10:
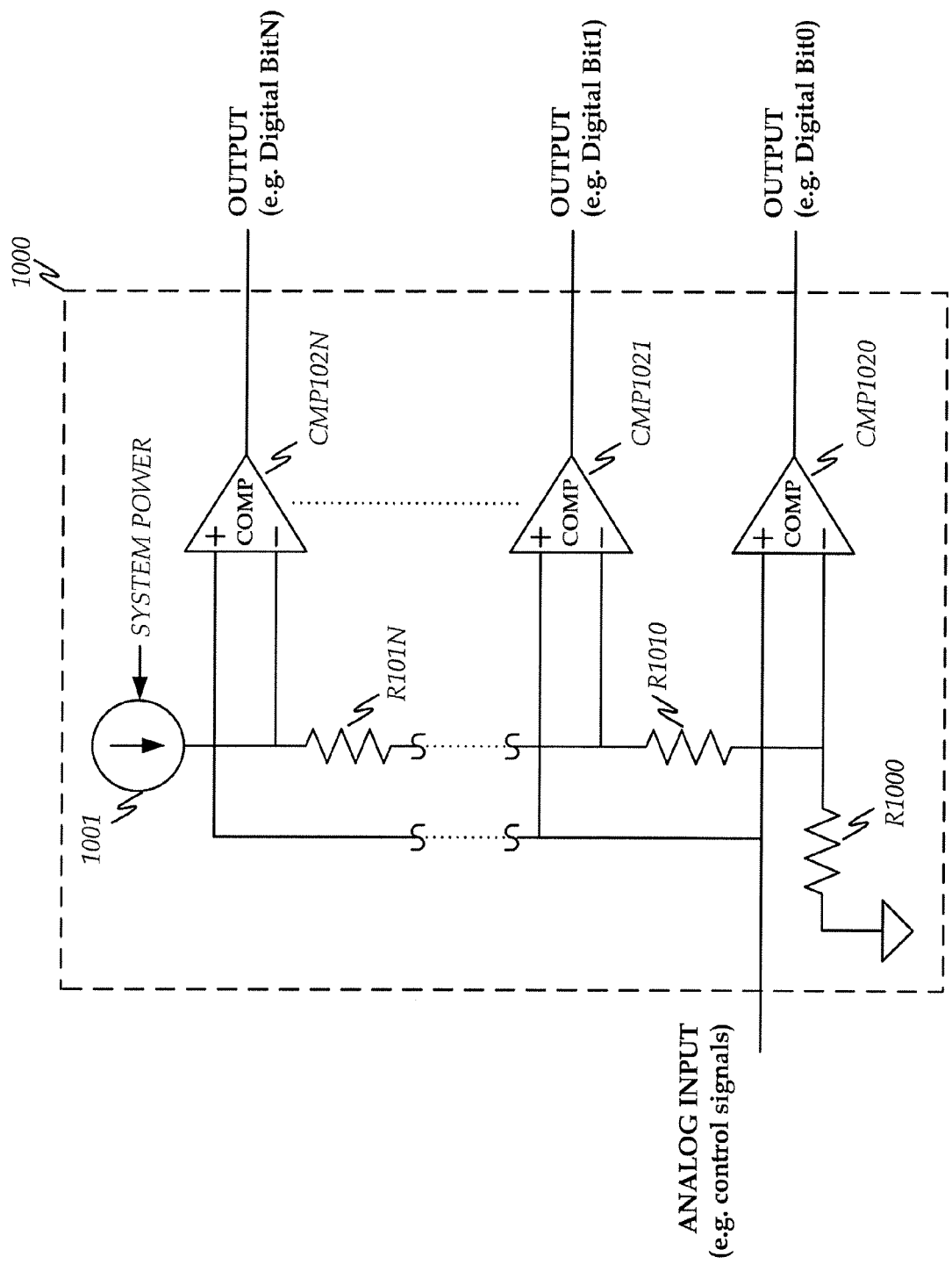
FIGS. 10 and 11 illustrate example circuit arrangements for a VTRD interface system associated with I/O communication and control in a VTRD device.

FIG. 10 illustrates an example VTRD interface system (1000) circuit arrangement employing an analog input control and digital outputs (e.g. Bit0-BitN). VTRD interface system (1000) includes resistor circuits R1000 and R1010-R101N, current source 1001, and comparator circuits CMP1020 and CMP1021-CMP102N.

The analog input is coupled to the non-inverting input terminals of each comparator circuit (CMP1020, CMP1021-CMP102N). Resistor circuit R1000 couples the inverting input of comparator circuit CMP1020 to a VTRD ground reference. Resistor circuit R010 couples the inverting input of comparator circuit CMP1020 to the inverting input of comparator circuit CMP1021. Resistor circuit R101N couples the inverting input of comparator circuit CMP1021 to the inverting input of comparator circuit CMP102N. The inverting input of comparator circuit CMP102N is in turn coupled to the current source (1001) which derives power from the VTRD system power, thus providing a unique fixed voltage level for each comparator circuit inverting input. The output from comparator circuit CMP1020 represents digital output Bit0. The output from comparator circuit CMP1021 represents digital output Bit1. The output from comparator circuit CMP102N represents digital output BitN.

The circuit topology described above for FIG. 10 is an analog-to-digital converter circuit known as a flash-converter which converts analog input levels (e.g. VTRD interface analog control signals) to discrete digital output states represented by the comparator circuit outputs. The VTRD interface system provided for FIG. 10 is merely one example of an analog-to-digital interface of which many other implementations are contemplated.

Figure 11:
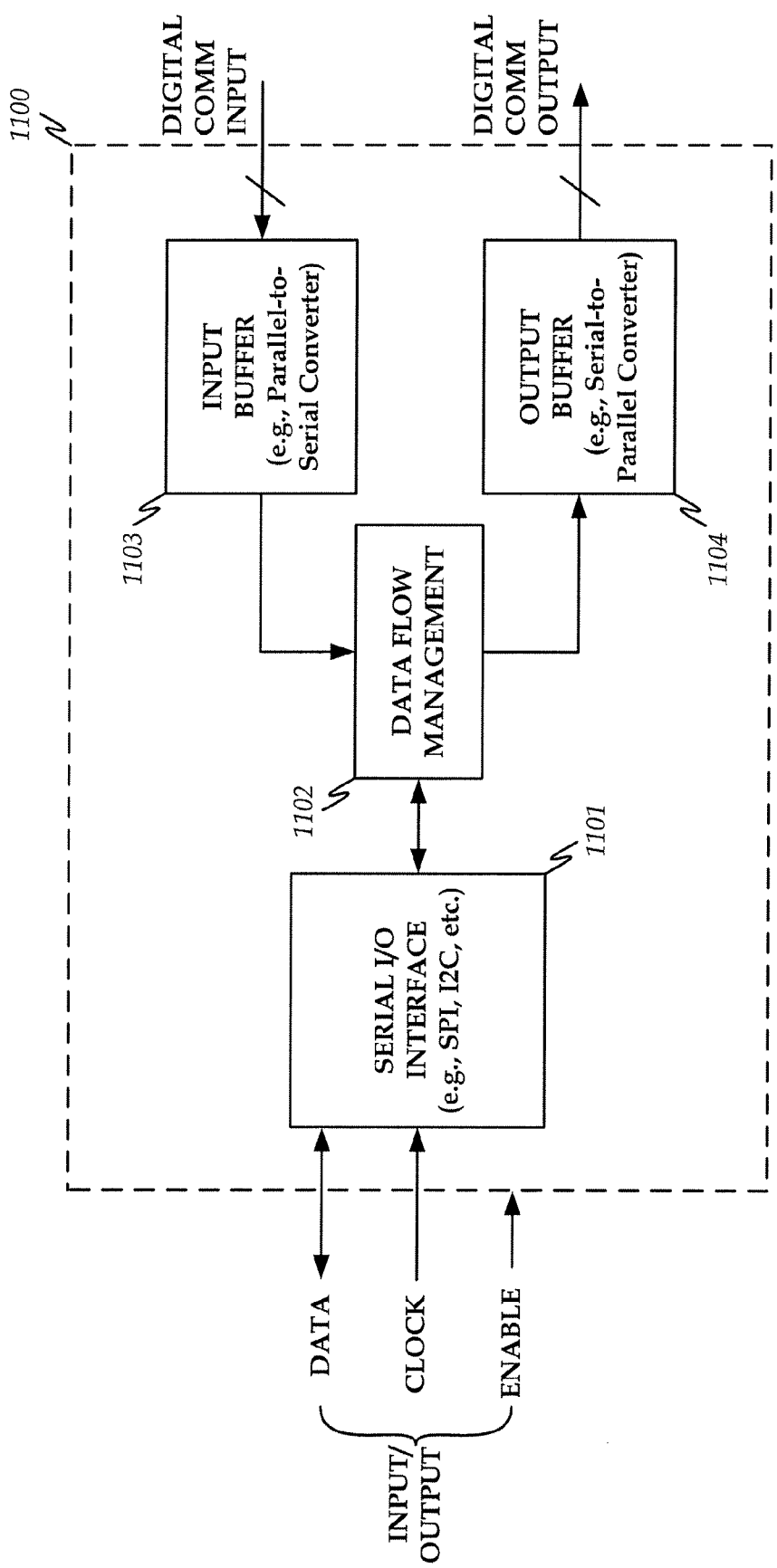

FIG. 11 illustrates an example VTRD interface system (1100) employing digital input and output communication means. VTRD interface system (1100) includes a serial I/O interface (101) (e.g. SPI, I2C, etc.), a data flow management system (1102), an input buffer (1103) (e.g. parallel-to-serial converter), and an output buffer (1104) (e.g. serial-to-parallel converter).

The VTRD interface system (1100) may include an enable terminal that can be used to selectively activate or deactivate communication circuitry in the VTRD interface system (1100). The serial I/O interface (1101) may include a bidirectional data terminal and a clock terminal, and is arranged for serial clocking of a data signal (DATA) to/from the VTRD system control (e.g. 220) in response to a clock signal (CLOCK). The serial I/O interface (1101), input buffer (1103), and output buffer (1104) are coupled to the data flow management system (1102), which is arranged to negotiate data flow timing and data flow direction between the serial I/O interface (1101) and the input/output buffers (1103/1104).

The various functional and/or physical partitions illustrated by FIG. 11 are merely intended to serve as example functional and/or physical partitions, and the various partitions may be separated or integrated into one or more different physical and or functional partitions. The VTRD interface system provided for FIG. 11 is merely one example of a digital communication interface of which many other implementations are contemplated.

Figure 12:
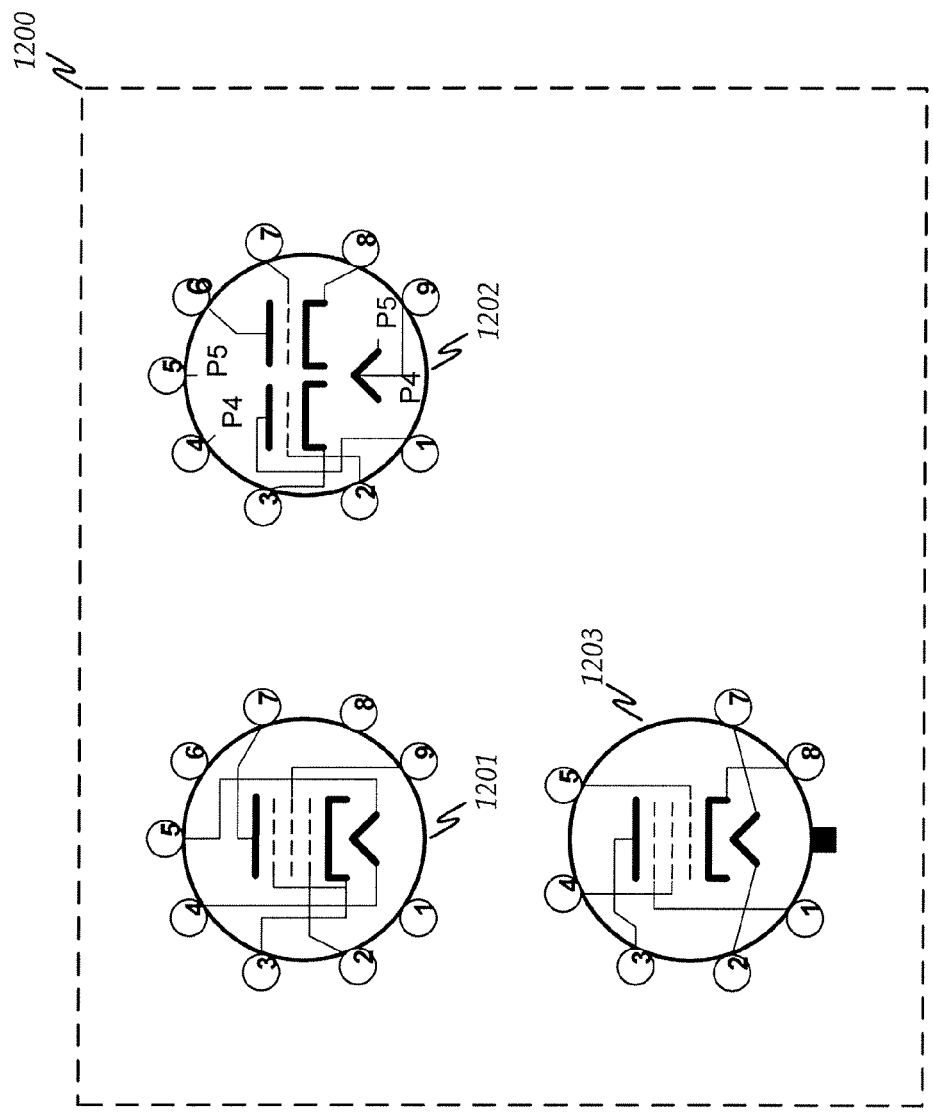
FIG. 12 illustrates example socket pin-configurations for example traditional glass-envelope vacuum tube devices that are contemplated for direct pin-replacement structures.

Example standard vacuum tube pin arrangements are illustrated in FIG. 12. Example (1201) illustrates a 9 pin pentode such as an EL84/6BQ5. Example (1202) illustrates a 9 pin dual (twin) triode such as a 12AX7. Example (1203) illustrates a keyed 7 pin pentode in an "octal arrangement" or 7-pin octal, such as an EL34, 6V6, or 6550.

Example preamplifier devices include 12AX7/ECC83/7025/5751 style preamplifier vacuum tubes, 12AU7/12BH7/ECC99/6191/ECC82 style preamplifier vacuum tubes, 12AT7/6201/ECC81 style preamplifier vacuum tubes, 6DJ8/ECC88/6922/ECC88 style preamplifier vacuum tubes, 12AY7 preamplifier vacuum tubes, 6N1P/6H30/6C45PI type preamplifier vacuum tubes, to name a few. Example data sheets associated with preamplifier vacuum tubes, including pin arrangements, are illustrated in Appendix A.

Example power-amplifier devices include 6BQ5/EL84/ 7189/SV83/6P14P/6P 15P style power-amplifier vacuum tubes, 6550/KT88/KT90 style power-amplifier vacuum tubes, 6CA7/EL34 style power-amplifier vacuum tubes, 6L6/ 5881/KT66/7027 style power-amplifier vacuum tubes, and 6V^GTA/7408 style power-amplifier vacuum tubes. Example data sheets associated with power-amplifier vacuum tubes, including pin arrangements, are illustrated in Appendix B.

Although the invention has been described herein by way of example embodiments, variations in the structures and methods described herein may be made without departing from the spirit and scope of the invention. For example, the positioning of the various functions and components may be varied. Individual components and arrangements of components may be substituted as will be appreciated by one skilled in the art having read the instant disclosure. Since many embodiments of the invention can be made without departing from the spirit and scope of the invention, the invention is not limited except as by the appended claims.

What is claimed is:

1. A vacuum tube replacement device (VTRD) that is arranged for expanded functionality, wherein the VTRD includes a plate terminal, a grid terminal, a cathode terminal, and two filament terminals that are arranged for coupling to a vacuum tube socket, the VTRD comprising:

a high voltage buffer system that is coupled between the plate terminal and a first node, and arranged to isolate high voltages at the plate terminal from the first node;

a power conditioning system that is coupled to the two filament terminals, and arranged to generate a local power supply from power received by the two filament terminals;

a variable control system that includes a signal input terminal that is coupled to the grid terminal, an output terminal that is coupled to the first node, a feedback terminal that is coupled to the plate terminal, a return terminal that is coupled to the cathode terminal, and an input-output terminal, wherein the variable control system is configured to dynamically control current flow between the output terminal and the return terminal in response to signals received at the signal input terminal, the variable control system comprising:

a variable control means including a variable control means signal input terminal, a variable control means feedback terminal, a variable control means output terminal, and a variable control means return terminal;

an input network including an input network input terminal that is coupled to the signal input terminal and an input network output terminal that is coupled to the variable control means signal input terminal, wherein the input network is arranged to provide a first characteristic impedance for the variable control system;

an output network including an output network input terminal that is coupled to the variable control means output terminal, and an output network output terminal that is coupled to the output terminal of the variable control system, wherein the output network has a second characteristic impedance for the variable control system;

a return network including a return network input terminal that is coupled to the variable control means return terminal, and a return network output terminal, wherein the return network has a third characteristic impedance for the variable control system; and a feedback network including a first feedback network input terminal that is coupled to the return network output terminal, a second feedback network input terminal that is coupled to the feedback terminal of the variable control system, a feedback network return terminal that is coupled to the return terminal for the variable control system, and a feedback network output terminal that is coupled to the variable control means feedback terminal; and an extended VTRD function control system that is operated from the local power supply and includes an input-output terminal that is coupled to the input-output terminal of the variable control system, wherein the input-output terminal of the variable control system is coupled to a corresponding input-output terminal for at least one member of the group comprising: the input network, the output network, the return network, the feedback network, and the variable control means, wherein the extended VTRD function control system is arranged to modify an operational performance feature of the variable control system circuit via a control signal that is provided at the input-output terminal of extended VTRD function control system.

2. The VTRD of claim 1, wherein the input network includes an adjustable impedance circuit that is coupled to the signal input terminal, wherein the adjustable impedance circuit is arranged to adjustably control the first characteristic input impedance in response to the control signal from the extended VTRD function control system.

3. The VTRD of claim 1, wherein the input network includes a signal limiter circuit that is coupled to the signal input terminal, and wherein the input network is arranged to adjustably control an input signal limit for the signal input terminal in response to the control signal from the extended VTRD function control system.

4. The VTRD of claim 1, wherein the input network includes an electrostatic discharge (ESD) protection circuit that is coupled to the signal input terminal.

5. The VTRD of claim 1, wherein the output network includes a current limiter circuit that is arranged to adjustably limit the current flow for the variable control means output terminal in response to the control signal from the extended VTRD function control system.

6. The VTRD of claim 1, wherein the output network includes a bandwidth control circuit that is arranged to adjustably modify signal bandwidth for with the variable control means output terminal in response to the control signal from the extended VTRD function control system.

7. The VTRD of claim 1, wherein the output network includes an analog-to-digital converter circuit.

8. The VTRD of claim 1, wherein the return network includes a gain control circuit that is arranged to adjustably modify signal gain associated with the variable control means return terminal in response to the control signal from the extended VTRD function control system.

9. The VTRD of claim 1, wherein the return network includes a bandwidth control circuit that is arranged to adjustably modify signal bandwidth associated with the variable control means return terminal in response to the control signal from the extended VTRD function control system.

10. The VTRD of claim 1, wherein the feedback network is configured to either set a bias condition for the VTRD, sense an auxiliary signal, or provide a non-linear VTRD transfer function dynamic.

11. The VTRD of claim 1, wherein the feedback network comprising a differential amplifier circuit, a capacitance circuit, a first resistor circuit and a second resistor circuit, wherein the capacitor circuit is coupled between an output terminal of the differential amplifier circuit and an inverting input terminal of the differential amplifier circuit, the first resistor circuit is coupled between the feedback terminal of the variable control means and the inverting input terminal of the differential amplifier circuit, the second resistor circuit is coupled between the feedback terminal of the variable control system and the inverting input terminal of the differential amplifier circuit, the output of the differential amplifier circuit is coupled to the return network output terminal, and a power return for the differential amplifier circuit that is coupled to the return terminal.

12. The VTRD of claim 11, wherein the capacitor circuit has a variable characteristic capacitance that is adjusted in response to the control signal from the extended VTRD function control system.

13. The VTRD of claim 11, wherein either the first resistor circuit or the second resistor circuit has a variable characteristic resistance that is adjusted in response to the control signal from the extended VTRD function control system.

14. The VTRD of claim 11, further comprising a voltage reference circuit that is arranged to provide a reference voltage to a non-inverting input terminal of the differential amplifier circuit, wherein the voltage reference circuit is configured to adjustably vary the reference voltage in response to the control signal from the extended VTRD function control system such that a biasing for the VTRD is programmably adjusted.

15. The VTRD of claim 11, the feedback network further comprising a second capacitor circuit, a third resistor circuit, a fourth resistor circuit, and a comparator circuit, wherein the second capacitor circuit is coupled between the variable control means return terminal and an inverting input terminal of the comparator circuit, the third resistor circuit is coupled between the inverting input terminal of the comparator circuit and the inverting input terminal of the differential amplifier circuit, and wherein an output terminal of the comparator circuit is coupled to the input-output terminal of the variable control system.

16. The VTRD of claim 15, further comprising a voltage reference circuit that is arranged to provide a reference voltage to a non-inverting input terminal of the comparator circuit, wherein the voltage reference circuit is configured to adjustably vary the reference voltage in response to the control signal from the extended VTRD function control system.

17. The VTRD of claim 1, the return network comprising an adjustable impedance circuit that includes a plurality of resistor circuits that are selectively coupled in parallel with one another to change the third characteristic impedance in response to the control signal from the extended VTRD function control system.

18. The VTRD of claim 1, the return network comprising an adjustable impedance circuit that includes a plurality of series circuits that are selectively coupled in parallel with one another to change the third characteristic impedance in response to the control signal from the extended VTRD function control system, wherein each series circuit has a characteristic frequency response that is determined by a resistor circuit that is series coupled to a capacitor circuit.

19. The VTRD of claim 1, the return network comprising:
a resistor circuit that is coupled between the variable control means return terminal and a programmable voltage source;

an analog-to-digital converter (ADC) circuit that is operated from the local power supply, wherein the ADC circuit includes an ADC input coupled to the variable control means return terminal and an ADC output, wherein the ADC circuit is arranged to provide digitally encoded signals at the ADC output in response to signals from the ADC input;

a digital signal processor (DSP) circuit that is operated from the local power supply, wherein the DSP circuit includes a DSP input coupled to the ADC output, and a DSP output, wherein the DSP circuit is arranged to execute real-time signal processing function on signals from the DSP input to provide processed signals at the DSP output; and a digital-to-analog converter (DAC) circuit that is operated from the local power supply, wherein the DAC circuit includes a DAC input coupled to the DSP output, and a DAC output coupled to the return terminal of the variable control system, wherein the DAC circuit is arranged to provide a current signal at the DAC output in response to signals from the DAC input.

20. The VTRD of claim 1, the input network comprising a resistor circuit that is series coupled between the signal input terminal and the variable control means signal input terminal.

21. The VTRD of claim 1, the input network comprising a first resistor circuit that is coupled between the signal input terminal and the variable control means signal input terminal and a second resistor circuit that is coupled between the variable control means signal input terminal and the return terminal for the variable control system, wherein the first and second resistor circuits have a corresponding first and second resistance values, and wherein the first characteristic impedance for the variable control system is determined by the first and second resistance values, and wherein one of the first and second resistance values is adjusted in response to the control signal from the extended VTRD function control system.

22. The VTRD of claim 21, wherein the second resistance circuit comprises a plurality of selectable resistance circuits that are selectively coupled in parallel with one another in response to the control signal from the extended VTRD function control system.

23. The VTRD of claim 21, wherein the second resistance circuit comprises a transistor that is configured to operate as a linear resistor that is responsive to the control signal from the extended VTRD function control system.

24. The VTRD of claim 1, the input network comprising a diode circuit that is coupled between the variable control means signal input terminal and a voltage source, wherein the diode circuit and the voltage source are arranged to limit an input dynamic range associated with the signal input terminal.

25. The VTRD of claim 23, wherein the voltage source is adjusted in response to the control signal from the extended VTRD function control system.

26. The VTRD of claim 1, the input network comprising a first diode circuit that is coupled between the variable control means signal input terminal and a first adjustable voltage source, and a second diode circuit that is coupled between a second adjustable voltage source and the variable control means signal input terminal, wherein the first diode circuit and the first voltage source are arranged to limit an input dynamic range associated with the signal input terminal for a positive input signal, and wherein the second diode circuit and the second voltage source are arranged to limit the input dynamic range associated with the signal input terminal for a negative input signal.

27. The VTRD of claim 26, wherein one of the first voltage source and the second voltage source is adjusted in response to the control signal from the extended VTRD function control system.

28. The VTRD of claim 1, the output network comprising an adjustable impedance circuit that includes a plurality of resistor circuits that are selectively coupled in parallel with one another to change the second characteristic impedance in response to the control signal from the extended VTRD function control system.

29. The VTRD of claim 1, the output network comprising an adjustable impedance circuit that includes a plurality of series circuits that are selectively coupled in parallel with one another to change the second characteristic impedance in response to the control signal from the extended VTRD function control system, wherein each series circuit has a characteristic frequency response that is determined by a resistor circuit that is series coupled to a capacitor circuit.

30. The VTRD of claim 1, the output network comprising:
   a resistor circuit that is coupled between the variable control means output terminal and a programmable voltage source;
   an analog-to-digital converter (ADC) circuit that is operated from the local power supply, wherein the ADC circuit includes an ADC input coupled to the variable control means output terminal and an ADC output, wherein the ADC circuit is arranged to provide digitally encoded signals at the ADC output in response to signals from the ADC input;
   a digital signal processor (DSP) circuit that is operated from the local power supply, wherein the DSP circuit includes a DSP input coupled to the ADC output, and a DSP output, wherein the DSP circuit is arranged to execute real-time signal processing function on signals from the DSP input to provide processed signals at the DSP output; and
   a digital-to-analog converter (DAC) circuit that is operated from the local power supply, wherein the DAC circuit includes a DAC input coupled to the DSP output, and a DAC output coupled to the output terminal of the variable control system, wherein the DAC circuit is arranged to provide a current signal at the DAC output in response to signals from the DAC input.

31. The VTRD of claim 1, further comprising a filament communication system that is coupled to the two filament terminals and arranged to facilitate communications using the two filament terminals as a communication channel, wherein an output of the filament communication system is coupled to the extended VTRD function control system for adjusting the control signal.

32. The VTRD of claim 1, further a current measurement system that is coupled between the VTRD cathode terminal and the return terminal of the variable control system, wherein the current measurement system is arranged to sense a return path current to the VTRD cathode terminal and also arranged to communicate the sensed return path current to the extended VTRD function control system.

33. The VTRD of claim 1, further comprising a measurement system that is coupled to the extended VTRD function control system, wherein the measurement system is arranged to determine a measurement for one of an operating temperature, a power dissipation measurement, a system voltage performance, or an operating current, wherein the measurement system is also arranged to communicate the determined measurement to the extended VTRD function control system.

34. The VTRD of claim 1, further comprising a measurement system that is coupled to the extended VTRD function control system, wherein the measurement system is arranged to identify a status measurement for one of a clipping in the VTRD plate terminal voltage, a system state query for the VTRD, a total time of operation for the VTRD, a state-based quiescent current setting for the VTRD, a bias current setting for the VTRD, or an identification of a wear-out status of the VTRD, wherein the measurement system is also arranged to communicate the identified status measurement to the extended VTRD function control system.

35. The VTRD of claim 1, further comprising an extended communications interface that is coupled to the extended VTRD function control system and arranged to operate a communication channel, wherein the communication channel comprises one of a radio-frequency (RF) communication, a Blue-Tooth communication, a ZigBee communication, an infrared (IR) communication, and an optical communication.

36. The VTRD of claim 1, further comprising an extended VTRD function control system that is configured to either store VTRD functional settings or retrieve previously stored VTRD functional settings, wherein the VTRD functional settings are provided by one member of the group comprising: a user, an original equipment manufacturer (OEM), or a manufacturer.

37. A vacuum tube replacement device (VTRD) that is arranged for expanded functionality, wherein the VTRD includes a plate terminal, a grid terminal, a cathode terminal, and two filament terminals that are arranged for coupling to a vacuum tube socket, the VTRD comprising:
   a high voltage buffer system that is coupled between the plate terminal and a first node, and arranged to isolate high voltages at the plate terminal from the first node;
   a power conditioning system that is coupled to the two filament terminals, and arranged to generate a local power supply from power received by the two filament terminals;
   a variable control system that includes a signal input terminal that is coupled to the grid terminal, an output terminal that is coupled to the first node, a feedback terminal that is coupled to the plate terminal, a return terminal that is coupled to the cathode terminal, and an input-output terminal, wherein the variable control system is configured to dynamically control current flow between the output terminal and the return terminal in response to signals received at the signal input terminal, the variable control system comprising:
      a variable control means including a variable control means signal input terminal, a variable control means feedback terminal, a variable control means output terminal, and a variable control means return terminal;
      an input network including an input network input terminal that is coupled to the signal input terminal and an input network output terminal that is coupled to the variable control means signal input terminal, wherein the input network is arranged to provide a first characteristic impedance for the variable control system;
      an output network including an output network input terminal that is coupled to the variable control means output terminal, an output network output terminal that is coupled to the output terminal of the variable control system, and an output control terminal that is arranged to receive an output control signal, wherein the output network has an adjustable operational characteristic that is varied in response to the output control signal, wherein the adjustable operational characteristic corresponds to either a gain characteristic or a frequency response characteristic for the VTRD, wherein the output network has a second characteristic impedance for the variable control system;

a return network including a return network input terminal that is coupled to the variable control means return terminal, and a return network output terminal, wherein the return network has a third characteristic impedance for the variable control system; and a feedback network including a first feedback network input terminal that is coupled to the return network output terminal, a second feedback network input terminal that is coupled to the feedback terminal of the variable control system, a feedback network return terminal that is coupled to the return terminal for the variable control system, and a feedback network output terminal that is coupled to the variable control means feedback terminal; and an extended VTRD function control system that is operated from the local power supply and includes an input-output terminal that is coupled to the input-output terminal of the variable control system, wherein the input-output terminal of the variable control system is coupled to the output control terminal for the output network, wherein the extended VTRD function control system is arranged to adjustably vary the output control signal such that the adjustable operational characteristic of the output network is varied in response to the output control signal via a control signal that is provided at the input-output terminal of extended VTRD function control system.

38. A vacuum tube replacement device (VTRD) that is arranged for expanded functionality, wherein the VTRD includes a plate terminal, a grid terminal, a cathode terminal, and two filament terminals that are arranged for coupling to a vacuum tube socket, the VTRD comprising:

a high voltage buffer system that is coupled between the plate terminal and a first node, and arranged to isolate high voltages at the plate terminal from the first node;

a power conditioning system that is coupled to the two filament terminals, and arranged to generate a local power supply from power received by the two filament terminals;

a variable control system that includes a signal input terminal that is coupled to the grid terminal, an output terminal that is coupled to the first node, a feedback terminal that is coupled to the plate terminal, a return terminal that is coupled to the cathode terminal, and an input-output terminal, wherein the variable control system is configured to dynamically control current flow between the output terminal and the return terminal in response to signals received at the signal input terminal, the variable control system comprising:

a variable control means including a variable control means signal input terminal, a variable control means feedback terminal, a variable control means output terminal, and a variable control means return terminal;

an input network including an input network input terminal that is coupled to the signal input terminal and an input network output terminal that is coupled to the variable control means signal input terminal, wherein the input network is arranged to provide a first characteristic impedance for the variable control system;

an output network including an output network input terminal that is coupled to the variable control means output terminal, and an output network output terminal that is coupled to the output terminal of the variable control system, wherein the output network has a second characteristic impedance for the variable control system;

a return network including a return network input terminal that is coupled to the variable control means return terminal, a return network output terminal, and a return control terminal that is arranged to receive an return control signal, wherein the return network has an adjustable operational characteristic that is varied in response to the return control signal, wherein the adjustable operational characteristic corresponds to either a gain characteristic or a frequency response characteristic for the VTRD, wherein the return network has a third characteristic impedance for the variable control system; and a feedback network including a first feedback network input terminal that is coupled to the return network output terminal, a second feedback network input terminal that is coupled to the feedback terminal of the variable control system, a feedback network return terminal that is coupled to the return terminal for the variable control system, and a feedback network output terminal that is coupled to the variable control means feedback terminal; and an extended VTRD function control system that is operated from the local power supply and includes an input-output terminal that is coupled to the input-output terminal of the variable control system, wherein the input-output terminal of the variable control system is coupled to the return control terminal for the return network, wherein the extended VTRD function control system is arranged to adjustably vary the return control signal such that the adjustable operational characteristic of the return network is varied in response to the return control signal via a control signal that is provided at the input-output terminal of extended VTRD function control system.

* * * * *

UNITED STATES PATENT AND TRADEMARK OFFICE
CERTIFICATE OF CORRECTION

PATENT NO. : 7,482,863 B2 Page 1 of 1
APPLICATION NO. : 11/836674
DATED : January 27, 2009
INVENTOR(S) : Douglas H. Roberts It is certified that error appears in the above-identified patent and that said Letters Patent is hereby corrected as shown below:

Column 6, line 53: "comtemplated" should read "contemplated"

Column 12, line 7: "comtemplated" should read "contemplated"

Column 16, line 9: "R010" should read "R1010"

Column 16, line 33: "101" should read "1101"

Signed and Sealed this

Eleventh Day of August, 2009

David J. Kappos
*Director of the United States Patent and Trademark Office*